(12) United States Patent
Izawa

(10) Patent No.: US 12,108,584 B2
(45) Date of Patent: Oct. 1, 2024

(54) WIRE HARNESS

(71) Applicant: SUMITOMO WIRING SYSTEMS, LTD., Yokkaichi (JP)

(72) Inventor: Katsutoshi Izawa, Yokkaichi (JP)

(73) Assignee: SUMITOMO WIRING SYSTEMS, LTD., Mie (JP)

(*) Notice: Subject to any disclaimer, the term of this patent is extended or adjusted under 35 U.S.C. 154(b) by 126 days.

(21) Appl. No.: 17/798,520

(22) PCT Filed: Feb. 17, 2021

(86) PCT No.: PCT/JP2021/005795
§ 371 (c)(1),
(2) Date: Aug. 9, 2022

(87) PCT Pub. No.: WO2021/172120
PCT Pub. Date: Sep. 2, 2021

(65) Prior Publication Data
US 2023/0092669 A1    Mar. 23, 2023

(30) Foreign Application Priority Data
Feb. 25, 2020 (JP) ................. 2020-029723

(51) Int. Cl.
*H05K 9/00* (2006.01)
*B60R 16/02* (2006.01)
(Continued)

(52) U.S. Cl.
CPC ....... *H05K 9/0098* (2013.01); *B60R 16/0215* (2013.01); *H01B 7/0045* (2013.01); *H02G 3/0406* (2013.01)

(58) Field of Classification Search
CPC ...... B60R 6/0207; B60R 6/0215; H05K 9/00; H05K 9/0007; H05K 9/0018; H05K 9/066;
(Continued)

(56) References Cited

U.S. PATENT DOCUMENTS 2,932,805 A * 4/1960 Doherty ................ H01B 7/306
                                                    333/243
2014/0182922 A1   7/2014 Imahori et al.
(Continued)

FOREIGN PATENT DOCUMENTS

JP    H11-298184 A    10/1999
JP    2014-239145 A   12/2014

OTHER PUBLICATIONS

Apr. 27, 2021 International Search Report issued in International Patent Application No. PCT/JP2021/005795.

*Primary Examiner* — Paresh Paghadal
(74) *Attorney, Agent, or Firm* — Oliff PLC

(57) ABSTRACT

A wire harness including: a first wire; a ring-shaped first electromagnetic wave absorber having a first through hole through which the first wire passes; a first restricting member that restricts relative movement of the first electromagnetic wave absorber with respect to the first wire in a length direction of the first wire; a second wire; a ring-shaped second electromagnetic wave absorber having a second through hole through which the second wire passes; and a second restricting member that restricts relative movement of the second electromagnetic wave absorber with respect to the second wire in a length direction of the second wire, wherein the first electromagnetic wave absorber is provided so as to overlap with a portion of the second electromagnetic wave absorber in a plan view from a first central axis direction in which a central axis of the first through hole extends.

4 Claims, 11 Drawing Sheets

(51) Int. Cl.
*H01B 7/00* (2006.01)
*H02G 3/04* (2006.01)

(58) Field of Classification Search
CPC ..... H05K 9/0098; H01F 27/266; H01F 17/06; H01F 2017/065; H02G 3/04
See application file for complete search history.

(56) References Cited

U.S. PATENT DOCUMENTS

2017/0174152 A1  6/2017  Yamaguchi et al.
2018/0233263 A1* 8/2018  Mizutani ................. H01F 17/06

\* cited by examiner ial view showing a wire harness according to a modified example.

WIRE HARNESS

BACKGROUND

This disclosure relates to a wire harness.

Conventionally, wire harnesses, which are provided with wires that electrically connect a plurality of electrical devices and electromagnetic wave absorbing members that absorb electromagnetic waves (electromagnetic noise) emitted from the wires, are known as wire harnesses that are mounted in vehicles such as hybrid vehicles and electric vehicles. As a result of inserting a plurality of wires into a through hole in an electromagnetic wave absorbing member constituted by a ferrite core, the electromagnetic wave absorbing member is provided on an outer circumference of the wires in a wire harness of this type (see JP 2014-130886A, for example).

SUMMARY

Incidentally, with the above-described wire harness, the larger the electromagnetic waves to be reduced are, the larger the size of the electromagnetic wave absorbing member is. When a plurality of wires are inserted into such a large electromagnetic wave absorbing member, there is a risk that the electromagnetic wave absorbing member may vibrate due to vibration accompanying traveling of the vehicle or the like, for example, and the wires may be shaken by the vibration of the electromagnetic wave absorbing member, and the wires may be damaged.

An exemplary aspect of the disclosure provides a wire harness capable of reducing damage to a wire.

The wire harness of the present disclosure includes: a first wire; a ring-shaped first electromagnetic wave absorber having a first through hole through which the first wire passes; a first restricting member that restricts relative movement of the first electromagnetic wave absorber with respect to the first wire in a length direction of the first wire; a second wire; a ring-shaped second electromagnetic wave absorber having a second through hole through which the second wire passes; and a second restricting member that restricts relative movement of the second electromagnetic wave absorber with respect to the second wire in a length direction of the second wire, wherein the first electromagnetic wave absorber is provided so as to overlap with a portion of the second electromagnetic wave absorber in a plan view from a first central axis direction in which a central axis of the first through hole extends.

According to the wire harness of the present disclosure, an effect of being able to reduce damage to a wire is exhibited.

DETAILED DESCRIPTION OF EMBODIMENTS

Figure 1:
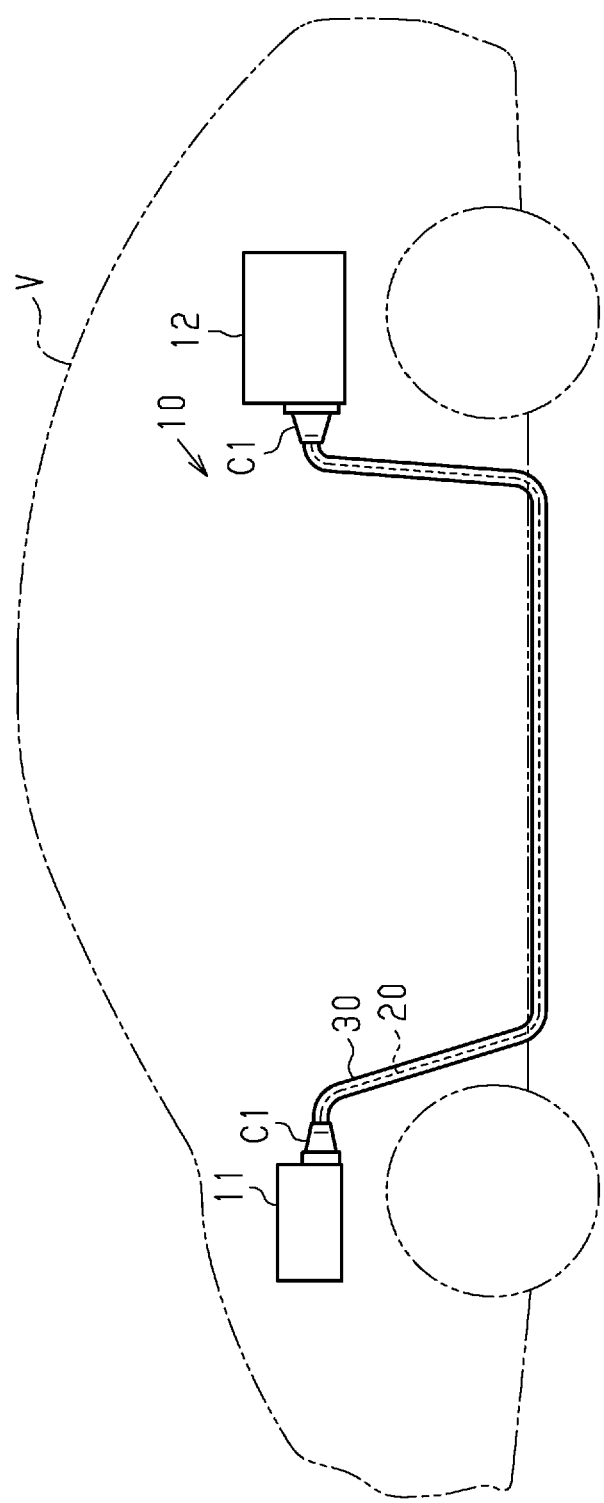
FIG. 1 is a schematic configuration diagram showing a wire harness according to an embodiment.

First, embodiments of the present disclosure will be listed and described.

[1] The wire harness of the present disclosure includes: a first wire member including a first wire; a ring-shaped first electromagnetic wave absorbing member having a first through hole through which the first wire member passes; a first restricting member that restricts relative movement of the first electromagnetic wave absorbing member with respect to the first wire member in a length direction of the first wire member; a second wire member including a second wire; a ring-shaped second electromagnetic wave absorbing member having a second through hole through which the second wire member passes; and a second restricting member that restricts relative movement of the second electromagnetic wave absorbing member with respect to the second wire member in a length direction of the second wire member, in which the first electromagnetic wave absorbing member is provided so as to overlap with a portion of the second electromagnetic wave absorbing member in a plan view from a first central axis direction in which a central axis of the first through hole extends.

According to this configuration, the first electromagnetic wave absorbing member is provided on the first wire member, and the second electromagnetic wave absorbing member is provided on the second wire member. That is, the first electromagnetic wave absorbing member and the second electromagnetic wave absorbing member are individually provided for the first wire member and the second wire member, respectively. As a result, the electromagnetic waves to be reduced in each of the first electromagnetic wave absorbing member and the second electromagnetic wave absorbing member can be made smaller compared to the case where one electromagnetic wave absorbing member is provided for a plurality of wire members. For this reason, compared to the case where one electromagnetic wave absorbing member is provided for a plurality of wire members, each of the first electromagnetic wave absorbing member and the second electromagnetic wave absorbing member can be made more compact, and mass of each of the first electromagnetic wave absorbing member and the second electromagnetic wave absorbing member can be reduced. As a result, if the first electromagnetic wave absorbing member and the second electromagnetic wave absorbing member vibrate accompanying the traveling of the vehicle or the like, the loads respectively input to the first wire member and the second wire member from the first electromagnetic wave absorbing member and the second electromagnetic wave absorbing member can be reduced. As a result, it is possible to suppress damage to the first wire member and the second wire member caused by the vibration of the first electromagnetic wave absorbing member and the second electromagnetic wave absorbing member. Consequently, it is possible to suppress damage to the first wire and the second wire.

Also, since the first electromagnetic wave absorbing member is provided so as to overlap with a portion of the second electromagnetic wave absorbing member in a plan view from the first central axis direction, it is possible to suppress an increase in the size of the wire harness.

Here, a "ring" in the present specification includes a circular ring having a circular outer edge shape, a ring having an elliptical or ovoid outer edge shape, a polygonal ring having a polygonal outer edge shape, and a ring having a polygonal outer edge shape with rounded corners, and refers to a ring whose outer shape is composed of any closed shape connected by straight lines or curved lines. A "ring" includes a ring that is a shape having a through hole in a plan view, a shape in which the outer edge shape and the inner circumference shape of the through hole are the same shape, and a shape in which the outer edge shape and the inner circumference shape of the through hole are different from each other. A "ring" includes a ring having a predetermined length extending along the central axis direction in which the central axis passing through the center of the through hole extends, and the length thereof may be large or small. Also, a "ring" in the present specification may be regarded as a ring overall, and includes an object having a notch in a portion thereof, as with a C-shaped object.

[2] It is preferable that an inner circumferential surface of the first through hole opposes an outer circumferential surface of the first wire member, when the first electromagnetic wave absorbing member is viewed along the central axis of the first through hole, the inner circumferential surface of the first through hole has a first portion and a second portion arranged at a position point-symmetrical to the first portion with respect to the central axis of the first through hole, and the first restricting member fixes the first electromagnetic wave absorbing member to the first wire member such that the first wire member is in contact with the first portion and is separated from the second portion.

According to this configuration, inside the first through hole of the first electromagnetic wave absorbing member, the first electromagnetic wave absorbing member and the first wire member are fixed to each other (integrated with each other) in a state in which the first wire member is in contact with the first portion and is arranged offset to the first portion side. For this reason, even if the first electromagnetic wave absorbing member vibrates accompanying traveling of the vehicle or the like, it is possible to suppress shaking of the first wire member in the first through hole caused by vibration of the first electromagnetic wave absorbing member. For example, compared to the case where the first electromagnetic wave absorbing portion and the first wire member are fixed in a state in which the first wire member is not in contact with the inner circumferential surface of the first through hole, it is possible to suppress movement of the first wire member in the first through hole caused by vibration of the first electromagnetic wave absorbing member. As a result, it is possible to suppress wearing of the first wire member caused by contact with the inner circumferential surface of the first through hole, and it is possible to suitably suppress damage to the first wire member caused by vibration of the first electromagnetic wave absorbing member.

Here, "opposing" as used in the present specification means that surfaces or members are in front of each other, and encompasses not only the case where they are completely in front of each other, but also the case where they are partially in front of each other. Also, the term "opposing" in the present specification encompasses both the case where a member different from two portions is interposed between the two portions and the case where nothing is interposed between the two portions.

[3] It is preferable that the first portion is a portion arranged at a position spaced apart from the second wire member relative to the second portion in a direction intersecting the first central axis direction.

According to this configuration, inside the first through hole, the first wire member is arranged offset to the side away from the second wire member. As a result, the first electromagnetic wave absorbing member and the second electromagnetic wave absorbing member can be largely overlapped with each other in a plan view from the first central axis direction. As a result, it is possible to suitably suppress an increase in the size of the wire harness.

[4] It is preferable that an inner circumferential surface of the second through hole opposes an outer circumferential surface of the second wire member, when the second electromagnetic wave absorbing member is viewed along a central axis of the second through hole, the inner circumferential surface of the second through hole has a third portion and a fourth portion arranged at a position point-symmetrical to the third portion with respect to the central axis of the second through hole, the third portion is a portion arranged at a position spaced apart from the first wire member relative to the fourth portion in a direction intersecting a second central axis direction in which the central axis of the second through hole extends, and the second restricting member fixes the second electromagnetic wave absorbing member to the second wire member such that the second wire member is in contact with the third portion and is separated from the fourth portion.

According to this configuration, inside the second through hole of the second electromagnetic wave absorbing member, the second electromagnetic wave absorbing member and the second wire member are fixed to each other (integrated with each other) in a state where the second wire member is in contact with the third portion and is arranged offset to the third portion side. For this reason, even if the second electromagnetic wave absorbing member vibrates accompanying traveling of the vehicle or the like, it is possible to suppress shaking of the second wire member in the second through hole caused by vibration of the second electromagnetic wave absorbing member. For example, compared to the case where the second electromagnetic wave absorbing portion and the second wire member are fixed in a state where the second wire member is not in contact with the inner circumferential surface of the second through hole, it is possible to suppress movement of the second wire member in the second through hole caused by vibration of the second electromagnetic wave absorbing member. As a result, it is possible to suppress wearing of the second wire member caused by contact with the inner circumferential surface of the second through hole, and it is possible to suitably suppress damage to the second wire member caused by vibration of the second electromagnetic wave absorbing member.

Also, inside the second through hole, the second wire member is arranged offset to the side away from the first wire member. As a result, the first electromagnetic wave absorbing member and the second electromagnetic wave absorbing member can be largely overlapped with each other in a plan view from the first central axis direction. As a result, it is possible to suppress an increase in the size of the wire harness.

[5] The inner circumferential surface of the first through hole opposes the outer circumferential surface of the first wire member, when the first electromagnetic wave absorbing member is viewed along the central axis of the first through hole, the inner circumferential surface of the first through hole has a first portion and a second portion arranged at a position point-symmetrical to the first portion with respect to the central axis of the first through hole, the second portion is a portion arranged at a position near the second wire member relative to the first portion in a direction intersecting the first central axis direction, and the first restricting member fixes the first electromagnetic wave absorbing member to the first wire member such that the first wire member is in contact with the second portion and is separated from the first portion.

According to this configuration, inside the first through hole of the first electromagnetic wave absorbing member, the first electromagnetic wave absorbing member and the first wire member are fixed to each other (integrated with each other) in a state where the first wire member is in contact with the second portion and is arranged offset to the second portion side. For this reason, even if the first electromagnetic wave absorbing member vibrates accompanying traveling of the vehicle or the like, it is possible to suppress shaking of the first wire member in the first through hole caused by vibration of the first electromagnetic wave absorbing member. For example, compared to the case where the first electromagnetic wave absorbing portion and the first wire member are fixed in a state in which the first wire member is not in contact with the inner circumferential surface of the first through hole, it is possible to suppress movement of the first wire member in the first through hole caused by vibration of the first electromagnetic wave absorbing member. As a result, it is possible to suppress wearing of the first wire member caused by contact with the inner circumferential surface of the first through hole, and it is possible to suitably suppress damage to the first wire member caused by vibration of the first electromagnetic wave absorbing member.

Also, inside the first through hole, the first wire member is arranged offset to the side near the second wire member. As a result, the first wire member and the second wire member can be provided in close proximity to each other. For this reason, for example, it is possible to reduce the size of the wire harness at the portion where the first electromagnetic wave absorbing member and the second electromagnetic wave absorbing member are not provided.

[6] It is preferable that the inner circumferential surface of the second through hole opposes the outer circumferential surface of the second wire member, when the second electromagnetic wave absorbing member is viewed along the central axis of the second through hole, the inner circumferential surface of the second through hole has a third portion and a fourth portion arranged at a position point-symmetrical to the third portion with respect to the central axis of the second through hole, the fourth portion is a portion arranged at a position near the first wire member relative to the third portion in a direction intersecting a second central axis direction in which the central axis of the second through hole extends, and the second restricting member fixes the second electromagnetic wave absorbing member to the second wire member such that the second wire member is in contact with the fourth portion and is separated from the third portion.

According to this configuration, inside the second through hole of the second electromagnetic wave absorbing member, the second electromagnetic wave absorbing member and the second wire member are fixed to each other (integrated with each other) in a state where the second wire member is in contact with the fourth portion and is arranged offset to the fourth portion side. For this reason, even if the second electromagnetic wave absorbing member vibrates accompanying traveling of the vehicle or the like, it is possible to suppress shaking of the second wire member in the second through hole caused by vibration of the second electromagnetic wave absorbing member. For example, compared to the case where the second electromagnetic wave absorbing portion and the second wire member are fixed in a state where the second wire member is not in contact with the inner circumferential surface of the second through hole, it is possible to suppress movement of the second wire member in the second through hole caused by vibration of the second electromagnetic wave absorbing member. As a result, it is possible to suppress wearing of the second wire member caused by contact with the inner circumferential surface of the second through hole, and it is possible to suitably suppress damage to the second wire member caused by vibration of the second electromagnetic wave absorbing member.

Also, inside the second through hole, the second wire is arranged on the side closer to the first wire. As a result, the first wire and the second wire can be provided in close proximity to each other. For this reason, for example, it is possible to further reduce the size of the wire harness at the portion where the first electromagnetic wave absorbing member and the second electromagnetic wave absorbing member are not provided.

[7] It is preferable to further include an electromagnetic shielding member that collectively surrounds the first wire member, the first electromagnetic wave absorbing member, the second wire member, and the second electromagnetic wave absorbing member.

According to this configuration, the electromagnetic waves emitted from the first wire can be reduced by the first electromagnetic wave absorbing member and the electromagnetic shielding member covering the outer circumference of the first electromagnetic wave absorbing member. Also, the electromagnetic waves emitted from the second wire can be reduced by the second electromagnetic wave absorbing member and the electromagnetic shielding member covering the outer circumference of the second electromagnetic wave absorbing member.

Furthermore, since the electromagnetic shielding member is provided so as to collectively surround the first electromagnetic wave absorbing member and the second electromagnetic wave absorbing member, the number of components can be reduced compared to the case where the electromagnetic shielding member is individually provided for the first electromagnetic wave absorbing member and the second electromagnetic wave absorbing member.

[8] It is preferable to further include a cushioning member that covers a side surface of the first electromagnetic wave absorbing member facing toward the second electromagnetic wave absorbing member.

According to this configuration, a cushioning member can be interposed between the first electromagnetic wave absorbing member and the second electromagnetic wave absorbing member. As a result, it is possible to suppress direct contact between the first electromagnetic wave absorbing member and the second electromagnetic wave absorbing member and it is possible to suppress damage to the first electromagnetic wave absorbing member and the second electromagnetic wave absorbing member caused by contact between the first electromagnetic wave absorbing member and the second electromagnetic wave absorbing member.

[9] It is preferable to further include: a first outer cover member that collectively accommodates the first wire member and the second wire member; and a protective member that covers an outer circumference of the first wire member, the second wire member, the first electromagnetic wave absorbing member, and the second electromagnetic wave absorbing member, which are exposed from the first outer cover member.

According to this configuration, the outer circumference of the first electromagnetic wave absorbing member and the second electromagnetic wave absorbing member is covered by the protective member. For this reason, a protective member can be interposed between the first electromagnetic wave absorbing member and second electromagnetic wave absorbing member and their peripheral components. As a result, it is possible to suppress direct contact between the first electromagnetic wave absorbing member and second electromagnetic wave absorbing member and the peripheral components, and therefore it is possible to suppress damage to the first electromagnetic wave absorbing member and the second electromagnetic wave absorbing member caused by contact with the peripheral components.

[10] It is preferable that the first wire member includes the first wire and a first covering member that covers an outer circumference of the first wire, the second wire member includes the second wire and a second covering member that covers an outer circumference of the second wire, the first covering member passes through the first through hole while covering the outer circumference of the first wire, and the second covering member passes through the second through hole while covering the outer circumference of the second wire.

According to this configuration, the first wire is inserted through the first through hole of the first electromagnetic wave absorbing member while covered by the first covering member, and the second wire is inserted through the second through hole of the second electromagnetic wave absorbing member while covered by the second covering member. For this reason, it is possible to suppress a case in which the inner circumferential surface of the first through hole comes into direct contact with the outer circumferential surface of the first wire, and it is possible to suppress a case in which the inner circumferential surface of the second through hole comes into direct contact with the outer circumferential surface of the second wire. As a result, it is possible to suitably suppress damage to the first wire and the second wire caused by contact with the inner circumferential surfaces of the first through hole and the second through hole.

Detailed Description of Embodiments of the Disclosure

A specific example of a wire harness according to this disclosure will be described with reference to the drawings below. In the drawings, some of the components may be exaggerated or simplified for the sake of description. Also, the dimensional proportions of some parts may differ from their actual proportions. "Parallel" and "orthogonal" in this specification include not only strictly parallel and orthogonal but also generally parallel and orthogonal in a range in which the effects of this embodiment are achieved. Note that the present disclosure is not limited to these examples, but is indicated by the claims, and all changes that fall within the meaning and range of equivalency of the claims are intended to be embraced therein.

Overall Configuration of Wire Harness 10

A wire harness 10 shown in FIG. 1 electrically connects two or three or more electric devices (devices). The wire harness 10 electrically connects, for example, an inverter 11 installed at the front of a vehicle V such as a hybrid vehicle or an electric vehicle, and a high-voltage battery 12 installed on the rear side of the vehicle V relative to the inverter 11. The wire harness 10 is routed, for example, so as to pass under a floor of the vehicle V or the like. For example, an intermediate portion of the wire harness 10 in the length direction is routed so as to pass outside the vehicle interior, such as under the floor of the vehicle V. The inverter 11 is connected to a wheel drive motor (not shown) that is a power source for vehicle travel. The inverter 11 generates AC power from the DC power of the high-voltage battery 12, and supplies the AC power to the motor. The high-voltage battery 12 is, for example, a battery capable of supplying a voltage of several hundred volts.

The wire harness 10 has one or a plurality of (in the present embodiment, two) wires 20, a pair of connectors C1 that are attached to both end portions of the wires 20, and an outer cover member 30 that collectively surrounds the plurality of wires 20.

Configuration of Wires 20

One end portion of each wire 20 is connected to the inverter 11 via the connector C1, and the other end of each wire 20 is connected to the high-voltage battery 12 via the connector C1. Each wire 20 is formed in a long shape so as to extend in the front-rear direction of the vehicle V, for example. Each wire 20 is formed so as to be bent in a two-dimensional shape or a three-dimensional shape, for example, depending on the routing path of the wire harness 10. Each wire 20 is a high-voltage wire that can handle, for example, a high voltage and a large current. Each wire 20 may be, for example, a shielded wire having an electromagnetic shielding structure, or a non-shielded wire having no electromagnetic shielding structure. Each wire 20 of this embodiment is a non-shielded wire.

Figure 2:
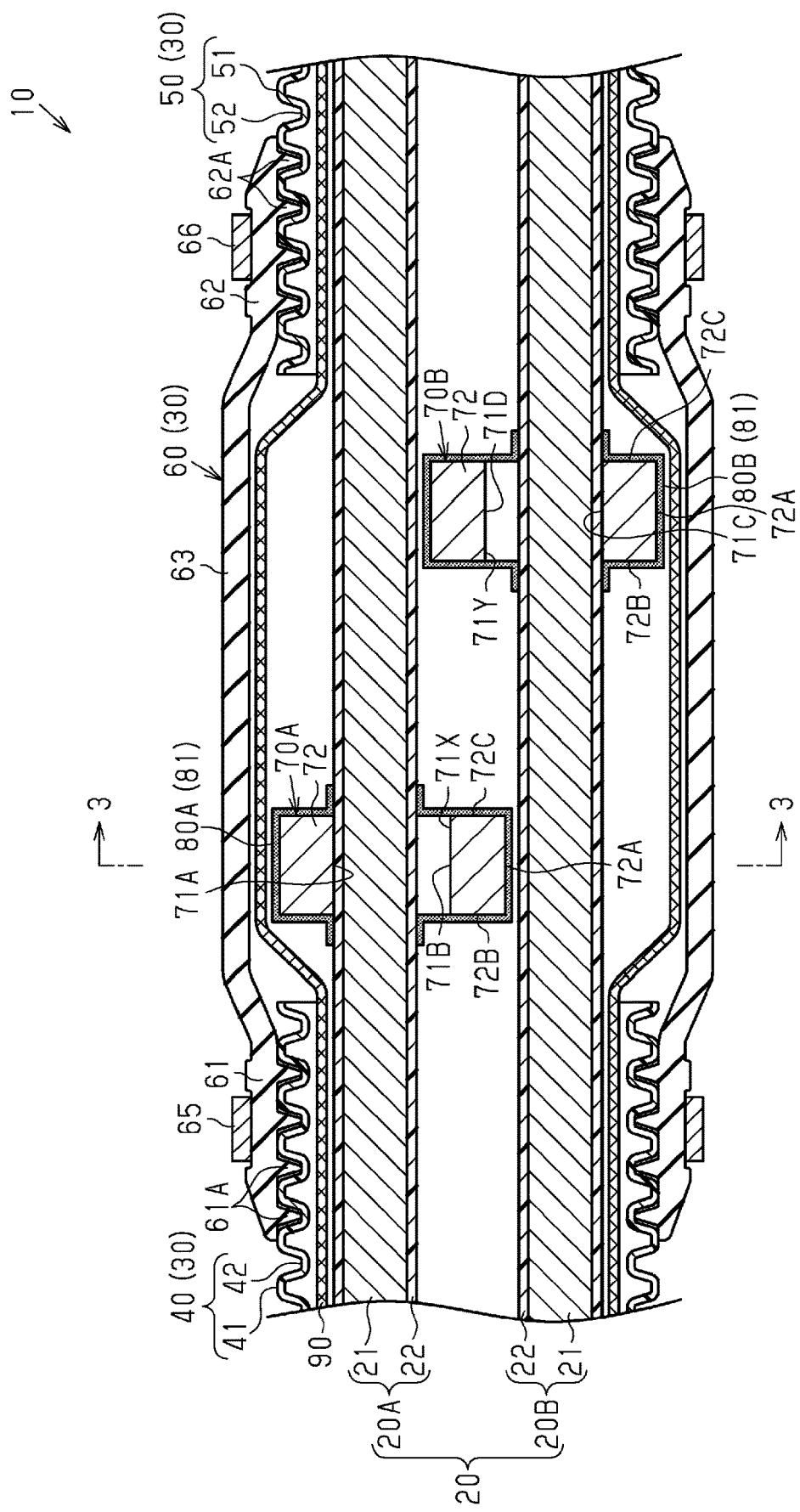
FIG. 2 is a schematic cross-sectional view showing a wire harness according to an embodiment.

As shown in FIG. 2, the wire 20 has a positive-side wire 20A connected to, for example, a positive terminal of the high-voltage battery 12 (see FIG. 1) and a negative-side wire 20B connected to the negative terminal of the high-voltage battery 12 (see FIG. 1).

The wires 20A and 20B are covered wires having a core wire 21 made of a conductor and an insulating covering 22 covering the outer circumference of the core wire 21. As the core wire 21, for example, a stranded wire made by twisting together a plurality of metal strands, a columnar conductor made of one columnar metal rod having a solid structure inside, a tubular conductor having a hollow structure inside, or the like can be used. As the core wire 21, for example, a stranded wire, a columnar conductor, and a tubular conductor may be used in combination. Examples of the columnar conductor include a single core wire and a bus bar. The core wire 21 of the present embodiment is a stranded wire. As the material of the core wire 21, for example, a metal material that is copper-based, aluminum-based, or the like can be used.

Configuration of Core Wire 21

The cross-sectional shape (i.e., a transverse cross-sectional shape) obtained by cutting the core wire 21 along a plane orthogonal to the length direction of the core wire 21 may be any shape. The transverse cross-sectional shape of each core wire 21 is a circular, semicircular, polygonal, square, or flat shape, for example. The transverse cross-sectional shape of the core wire 21 in this embodiment is a circular shape.

Configuration of Insulating Covering 22

The insulating coverings 22 respectively cover the outer circumferential surfaces of the core wires 21 over the entire circumference in the circumferential direction, for example. The insulating covering 22 is made of an insulating material such as a synthetic resin, for example. It is possible to use a synthetic resin containing polyolefin-based resin as a main component, such as crosslinked polyethylene or crosslinked polypropylene, as the material of the insulating covering 22, for example. Materials of one or more types can be used alone or in combination of two or more as the material of the insulating covering 22. The insulating covering 22 can be formed through, for example, extrusion molding (extrusion coating) performed on the core wire 21.

Configuration of Outer Cover Member 30

The outer cover member 30 shown in FIG. 1 has a long cylindrical shape overall. A plurality of wires 20 are accommodated in the internal space of the outer cover member 30. The outer cover member 30 is formed, for example, so as to surround the outer circumference of the plurality of wires 20 over the entire circumference in the circumferential direction. The outer cover member 30 protects the wires 20 from, for example, flying objects and water droplets. As the outer cover member 30, for example, a metal or resin pipe, a resin protector, a flexible corrugated tube made of resin, a rubber waterproof cover, or a combination thereof can be used. As the material of the metal pipe, a metal material such as a copper-based metal material or an aluminum-based metal material can be used. As the material of the resin protector and the corrugated tube, for example, a resin material having conductivity or a resin material having no conductivity can be used. As the resin material, for example, synthetic resins such as polyolefin, polyamide, polyester, and ABS resin can be used.

As shown in FIG. 2, the outer cover member 30 has, for example, a corrugated tube 40, a corrugated tube 50, and a protective member 60. As the material of the corrugated tubes 40 and 50 of the present embodiment, a resin material having no conductivity is used. As the resin material, for example, synthetic resins such as polyolefin, polyamide, polyester, and ABS resin can be used.

Configuration of Corrugated Tube 40

The corrugated tube 40 has, for example, a tubular shape that collectively surrounds the outer circumference of a plurality of wires 20A and 20B overall. The corrugated tube 40 is provided, for example, so as to surround the outer circumferences of the plurality of wires 20A and 20B over the entire circumference in the circumferential direction. The corrugated tube 40 is provided, for example, so as to surround a portion in the length direction (axial direction) of the wires 20A and 20B. The corrugated tube 40 has an accordion structure in which ring-shaped protrusions 41 and ring-shaped recesses 42 are arranged alternatingly along the length direction thereof. The corrugated tube 40 is more flexible than the core wire 21. The corrugated tube 40 of the present embodiment is formed in a cylindrical shape.

Configuration of Corrugated Tube 50

The corrugated tube 50 is provided, for example, spaced apart from the corrugated tube 40 in the length direction of the wires 20A and 20B. The corrugated tube 50 has, for example, a tubular shape that collectively surrounds the outer circumferences of the plurality of wires 20A and 20B overall. The corrugated tube 50 is provided, for example, so as to surround the outer circumference of the plurality of wires 20A and 20B over the entire circumference in the circumferential direction. The corrugated tube 50 is provided, for example, so as to surround a portion in the length direction of the wires 20A and 20B. The corrugated tube 50 has an accordion structure in which ring-shaped protrusions 51 and ring-shaped recesses 52 are arranged alternatingly along the length direction thereof. The corrugated tube 50 is more flexible than the core wire 21. The corrugated tube 50 of the present embodiment is formed in a cylindrical shape.

Configuration of Protective Member 60

The protective member 60 is provided so as to bridge between the outer circumference of the corrugated tube 40 and the outer circumference of the corrugated tube 50, for example. The protective member 60 has, for example, a tubular shape in which both ends in the length direction of the wires 20A and 20B are open. As the material of the protective member 60, for example, an elastic material having a relatively high hardness can be used. As the elastic material, for example, rubber such as ethylene propylene diene rubber or elastomer can be used.

Configuration of Wire Harness 10

The wire harness 10 has, for example, an electromagnetic wave absorbing member 70A (electromagnetic wave absorber) provided on a portion in the length direction of the wire 20A and an electromagnetic wave absorbing member 70B (electromagnetic wave absorber) provided on a portion in the length direction of the wire 20B. The wire harness 10 has, for example, a restricting member 80A that restricts relative movement of the electromagnetic wave absorbing member 70A with respect to the wire 20A in the length direction of the wire 20A, and a restricting member 80B that restricts relative movement of the electromagnetic wave absorbing member 70B with respect to the wire 20B in the length direction of the wire 20B. The electromagnetic wave absorbing member 70A is provided for, for example, one wire 20A. The electromagnetic wave absorbing member 70B is provided for, for example, one wire 20B. In other words, the electromagnetic wave absorbing members 70A and 70B are individually provided for each of the wires 20A and 20B. The electromagnetic wave absorbing member 70A and the electromagnetic wave absorbing member 70B are provided, for example, at positions spaced apart from each other in the length direction of the wires 20A and 20B.

Here, the electromagnetic wave absorbing member 70A and the electromagnetic wave absorbing member 70B have the same structure, and the restricting member 80A and the restricting member 80B have the same structure. For this reason, the electromagnetic wave absorbing member 70B is denoted by the same reference numerals as the electromagnetic wave absorbing member 70A, the restricting member 80B is designated by the same reference numerals as the restricting member 80A, and detailed description of each of these elements is omitted.

Configuration of Electromagnetic Wave Absorbing Member 70A

The electromagnetic wave absorbing member 70A is provided on the outer circumference of the wire 20A located between the corrugated tube 40 and the corrugated tube 50, for example. For example, in the length direction of the wire 20A, the corrugated tube 40 is provided on one side of the electromagnetic wave absorbing member 70A, and the electromagnetic wave absorbing member 70B and the corrugated tube 50 are provided on the other side of the electromagnetic wave absorbing member 70A. The electromagnetic wave absorbing member 70A is provided, for example, spaced apart from the corrugated tube 40 in the length direction of the wire 20A. The electromagnetic wave absorbing member 70A is provided, for example, spaced apart from the electromagnetic wave absorbing member 70B and the corrugated tube 50 in the length direction of the wire 20A. The electromagnetic wave absorbing member 70A is exposed from, for example, the corrugated tubes 40 and 50. The electromagnetic wave absorbing member 70A is provided so as to surround the outer circumference of one wire 20A, for example. The electromagnetic wave absorbing member 70A absorbs some of the electromagnetic waves (electromagnetic noise) emitted from the wire 20A, for example.

The electromagnetic wave absorbing member 70A has, for example, a through hole 71X through which one wire 20A passes. The electromagnetic wave absorbing member 70A has a ring shape, for example, due to having the through hole 71X. The electromagnetic wave absorbing member 70A has, for example, the through hole 71X in a plan view from the length direction of the wire 20A, and is formed in a ring shape having a predetermined length extending along a first central axis direction in which the central axis passing through the center of the through hole 71X extends. In the present embodiment, the first central axis direction of the electromagnetic wave absorbing member 70A is set to a direction extending parallel to the length direction of the wire 20A.

The through hole 71X is formed, for example, so as to pass through the electromagnetic wave absorbing member 70A in the length direction of the wire 20A. The wire 20A is provided so as to pass through the through hole 71X, for example. The inner circumferential surface of the through hole 71X opposes the outer circumferential surface of the wire 20A.

The electromagnetic wave absorbing member 70A of the present embodiment is composed of only a ring-shaped magnetic core 72. The magnetic core 72 of the present embodiment is formed in a circular ring shape. The magnetic core 72 has a function of reducing electromagnetic waves emitted from the wire 20A by being arranged so as to oppose the wire 20A over the entire circumference in the circumferential direction of the wire 20A, for example. The magnetic core 72 absorbs electromagnetic waves emitted from, for example, the wire 20A, and converts the energy of the electromagnetic waves into mechanical energy such as vibration, or thermal energy. As a result, adverse effects that the electromagnetic waves emitted from the wire 20A have on peripheral devices and the like are reduced.

The magnetic core 72 is, for example, a molded product containing a soft magnetic material. Examples of the soft magnetic material include iron (Fe), iron alloys and ferrites. Examples of the iron alloy include a Fe-silicon (Si) alloy and a Fe-nickel (Ni) alloy. As the magnetic core 72, for example, a ferrite core, an amorphous core, or a permalloy core can be used. The ferrite core is made of, for example, soft ferrite exhibiting soft magnetism. Examples of the soft ferrite include a ferrite containing nickel (Ni) and zinc (Zn) and a ferrite containing manganese (Mn) and zinc (Zn). The material of the magnetic core 72 can be appropriately selected, for example, according to the frequency band of the electromagnetic noise to be reduced.

Figure 3:
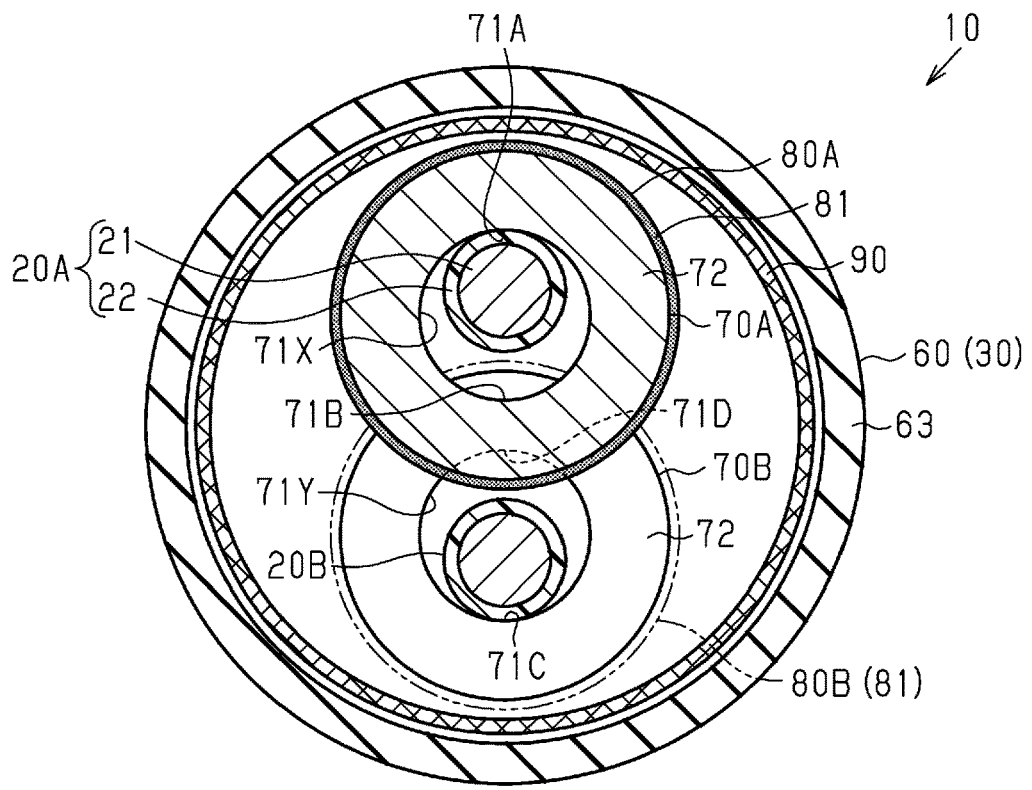
FIG. 3 is a schematic cross-sectional view (a cross-sectional view taken along line 3-3 in FIG. 2) showing a wire harness according to an embodiment.

As shown in FIG. 3, the magnetic core 72 of the present embodiment is formed continuously over the entire circumference in the circumferential direction, and is formed in a closed ring shape. That is, the magnetic core 72 of the present embodiment is formed in a structure in which the entirety is connected to form a continuous ring, that is, an endless structure in which the start point and the end point coincide with each other. In other words, no slit extending along the first central axis direction is formed in the magnetic core 72 of the present embodiment. The magnetic core 72 of this embodiment is constituted by one component. Note that in the present embodiment, the magnetic core 72 was constituted by one component, but a plurality of core materials may be combined to form a ring-shaped magnetic core 72. For example, the magnetic core 72 may be formed into a circular ring shape by combining a pair of core materials having a semicircular transverse cross section.

As shown in FIG. 2, the magnetic core 72 has, for example, an outer circumferential surface 72A extending along the circumferential direction of the magnetic core 72, a side surface 72B that extends along the radial direction of the magnetic core 72 and faces the corrugated tube 40 side, and a side surface 72C that extends along the radial direction of the magnetic core 72 and faces the corrugated tube 50 side. The side surfaces 72B and 72C are provided, for example, between the outer circumferential surface 72A and the inner circumferential surface of the through hole 71X. The outer circumferential dimension of the magnetic core 72 is set to be larger than the outer circumferential dimension of the corrugated tubes 40 and 50, for example. For this reason, the outer circumferential surface 72A of the magnetic core 72 is provided at a position protruding outward in the radial direction relative to the outer circumferential surfaces of the corrugated tubes 40 and 50.

Configuration of Restricting Member 80A

The restricting member 80A is provided, for example, so as to fix the electromagnetic wave absorbing member 70A to the outer circumference of the wire 20A.

The restricting member 80A is formed, for example, by winding a tape member 81 around the electromagnetic wave absorbing member 70A and the wire 20A. The tape member 81 has, for example, a pressure-sensitive adhesive layer on one surface. The tape member 81 is wound around the electromagnetic wave absorbing member 70A and the wire 20A, for example, with the pressure-sensitive adhesive layer facing inward in the radial direction. The tape member 81 is wound around, for example, the outer circumferential surface 72A of the electromagnetic wave absorbing member 70A and the outer circumferential surface of the wire 20A.

The tape member 81 is continuously wound around the range from the outer circumferential surface 72A of the magnetic core 72 to the outer circumferential surface of the wire 20A, for example. Although not shown in the drawings, the tape member 81 has, for example, an overlap winding structure. Here, the overlap winding structure is a structure in which the tape member 81 is spirally wound such that predetermined portions in the width direction of the tape member 81 overlap each other. Note that the width direction of the tape member 81 is a direction extending along the length direction of the wire 20. As the overlap winding structure, for example, a half-wrap winding structure is preferable. Here, the half-wrap winding structure is a structure in which the tape member 81 is spirally wound so that portions that are substantially halfway in the width direction of the tape member 81 overlap each other.

The tape member 81 covers the outer circumferential surface 72A of the electromagnetic wave absorbing member 70A, for example, so as to fasten it inward in the radial direction. The tape member 81 covers, for example, the outer circumferential surface 72A of the electromagnetic wave absorbing member 70A over the entire circumference in the circumferential direction. The electromagnetic wave absorbing member 70A is fixed to the wire 20A by being fastened inward in the radial direction by, for example, the tape member 81.

The tape member 81 covers the outer circumferential surface of the wire 20A, for example, so as to fasten it inward in the radial direction. The tape member 81 covers, for example, the outer circumferential surface of the wire 20A over the entire circumference in the circumferential direction.

As shown in FIG. 3, the tape member 81 is wound around the outer circumferential surfaces of the electromagnetic wave absorbing member 70A and the wire 20A such that, for example, the wire 20A is arranged offset to a portion in the circumferential direction of the through hole 71X inside the through hole 71X of the electromagnetic wave absorbing member 70A. When the electromagnetic wave absorbing member 70A is viewed along the central axis of the through hole 71X, the inner circumferential surface of the through hole 71X has a first portion 71A and a second portion 71B that is arranged at a position point-symmetrical to the first portion 71A with respect to the central axis of the through hole 71X. At this time, the wire 20A is in contact with the first portion 71A and is separated from the second portion 71B inside the through hole 71X. The first portion 71A of the present embodiment is a portion provided at a position farther from the wire 20B than the second portion 71B in the direction intersecting the first central axis direction of the electromagnetic wave absorbing member 70A. The tape member 81 fixes the electromagnetic wave absorbing member 70A to the outer circumference of the wire 20A such that, for example, the wire 20A is in contact with the first portion 71A and is separated from the second portion 71B. In other words, the electromagnetic wave absorbing member 70A is fixed to the outer circumferential surface of the wire 20A by the tape member 81 in a state where the wire 20A is in contact with the first portion 71A inside the through hole 71X and is offset to the first portion 71A side (in this embodiment, the side away from the wire 20B).

As shown in FIG. 2, for example, the wire 20A is arranged offset in the same direction, that is, to the first portion 71A side (here, the upper side in the drawing) over the entire length in the first central axis direction of the through hole 71X. The wire 20A of the present embodiment is arranged offset to the side away from the wire 20B over the entire length in the first central axis direction of the through hole 71X. In other words, the tape member 81 of the restricting member 80A is wound around the outer circumferential surfaces of the electromagnetic wave absorbing member 70A and the wire 20A such that the wire 20A is arranged offset in the same direction over the entire length in the first central axis direction of the through hole 71X.

Configuration of Electromagnetic Wave Absorbing Member 70B

The electromagnetic wave absorbing member 70B is provided, for example, on the outer circumference of the wire 20B located between the corrugated tube 40 and the corrugated tube 50. For example, in the length direction of the wire 20B, the electromagnetic wave absorbing member 70A and the corrugated tube 40 are provided on one side of the electromagnetic wave absorbing member 70B, and the corrugated tube 50 is provided on the other side of the electromagnetic wave absorbing member 70B.

The electromagnetic wave absorbing member 70B is provided, for example, at a position away from the electromagnetic wave absorbing member 70A in the length direction of the wires 20A and 20B. The electromagnetic wave absorbing member 70B is provided at a position separated from the electromagnetic wave absorbing member 70A by at least a length that is twice the length dimension along the first central axis direction of the electromagnetic wave absorbing member 70A in the length direction of the wires 20A and 20B.

The electromagnetic wave absorbing member 70B has, for example, a through hole 71Y in a plan view from the length direction of the wire 20B, and is formed in a ring shape having a predetermined length extending along a second central axis direction in which a central axis passing through the center of the through hole 71Y extends. The electromagnetic wave absorbing member 70B of the present embodiment is constituted by only a ring-shaped magnetic core 72. The magnetic core 72 of the electromagnetic wave absorbing member 70B has, for example, a function of reducing electromagnetic waves emitted from the wire 20B by being arranged so as to oppose the wire 20B over the entire circumference in the circumferential direction of the wire 20B. The wire 20B is provided so as to pass through the through hole 71Y, for example. The inner circumferential surface of the through hole 71Y opposes the outer circumferential surface of the wire 20B.

Configuration of Restricting Member 80B

The restricting member 80B is provided so as to fix the electromagnetic wave absorbing member 70B to the wire 20B, for example.

The restricting member 80B is formed, for example, by winding the tape member 81 around the electromagnetic wave absorbing member 70B and the wire 20B. The tape member 81 is continuously wound around, for example, the range from the outer circumferential surface 72A of the magnetic core 72 of the electromagnetic wave absorbing member 70B to the outer circumferential surface of the wire 20B. Although not shown in the drawings, the tape member 81 has, for example, an overlap winding structure.

As shown in FIG. 3, the tape member 81 of the restricting member 80B is wound around the outer circumferential surfaces of the electromagnetic wave absorbing member 70B and the wire 20B such that, for example, the wire 20B is arranged offset to a portion in the circumferential direction of the through hole 71Y inside the through hole 71Y of the electromagnetic wave absorbing member 70B. When the electromagnetic wave absorbing member 70B is viewed along the central axis of the through hole 71Y, the inner circumferential surface of the through hole 71Y has a third portion 71C and a fourth portion 71D arranged at a position point-symmetrical to third portion 71C with respect to the central axis of the through hole 71Y. At this time, the wire 20B is in contact with the third portion 71C and is separated from the fourth portion 71D inside the through hole 71Y. The third portion 71C of the present embodiment is a portion provided at a position farther from the wire 20A than the fourth portion 71D in the direction intersecting the second central axis direction of the electromagnetic wave absorbing member 70B. The tape member 81 of the restricting member 80B fixes the electromagnetic wave absorbing member 70B to the outer circumference of the wire 20B such that, for example, the wire 20B comes into contact with the third portion 71C and is separated from the fourth portion 71D. In other words, the electromagnetic wave absorbing member 70B is fixed to the outer circumferential surface of the wire 20B by the tape member 81 of the restricting member 80B in a state where the wire 20B is in contact with the third portion 71C inside the through hole 71Y and is offset to the third portion 71C side (in this embodiment, the side away from the wire 20A).

As shown in FIG. 2, for example, the wire 20B is arranged offset in the same direction, that is, to the third portion 71C side (here, the lower side in the drawing) over the entire length in the second central axis direction of the through hole 71Y. The wire 20B of the present embodiment is arranged offset to the side away from the wire 20A over the entire length in the second central axis direction of the through hole 71Y. In other words, the tape member 81 of the restricting member 80B is wound around the outer circumferential surfaces of the electromagnetic wave absorbing member 70B and the wire 20B such that the wire 20B is arranged offset in the same direction over the entire length in the second central axis direction of the through hole 71Y.

As shown in FIG. 3, the electromagnetic wave absorbing member 70A is provided, for example, so as to overlap with a portion of the electromagnetic wave absorbing member 70B in a plan view from the first central axis direction of the electromagnetic wave absorbing member 70A. For example, the lower portion of the electromagnetic wave absorbing member 70A is provided so as to overlap with the upper portion of the electromagnetic wave absorbing member 70B in a plan view from the first central axis direction. For example, the lower portion of the electromagnetic wave absorbing member 70A is provided so as to partially overlap with the through hole 71Y of the electromagnetic wave absorbing member 70B in a plan view from the first central axis direction.

Configuration of Braided Member 90

As shown in FIG. 2, the braided member 90 has, for example, a tubular shape that collectively surrounds the outer circumference of the plurality of wires 20A and 20B overall. The braided member 90 is provided, for example, so as to surround the outer circumference of the wires 20 over substantially the entire length in the length direction of the wires 20A and 20B. The braided member 90 is formed, for example, so as to collectively surround the outer circumference of the plurality of wires 20A and 20B in each of the internal spaces of the corrugated tubes 40 and 50, for example. In other words, the corrugated tubes 40 and 50 are provided so as to respectively surround the outer circumferences of the wires 20A and 20B and the braided member 90. The braided member 90 is formed, for example, so as to surround the outer circumferences of the electromagnetic wave absorbing members 70A and 70B between the corrugated tube 40 and the corrugated tube 50. The braided member 90 is formed such that, for example, the outer shape of the portions covering the electromagnetic wave absorbing members 70A and 70B is larger than the outer shape of the other portions. The braided member 90 is provided, for example, so as to surround the outer circumferences of the wires 20A and 20B, the electromagnetic wave absorbing members 70A and 70B, and the restricting members 80A and 80B in the internal space of the protective member 60.

As the braided member 90, a braided member in which a plurality of metal strands are braided or a braided member in which a metal strand and a resin strand are braided in combination with each other can be used. As the material of the metal wire, for example, a metal material that is copper-based, aluminum-based, or the like can be used. As the resin strand, for example, reinforcing fibers having excellent insulating properties and shear resistance such as para-aramid fibers can be used. Note that, although not shown in the drawings, both end portions of the braided member 90 are connected to ground (grounded) at, for example, a connector C1 (see FIG. 1) or the like.

Configuration of Protective Member 60

The protective member 60 is provided so as to surround the outer circumferences of the electromagnetic wave absorbing members 70A and 70B, for example. The protective member 60 functions as, for example, a waterproof cover for waterproofing various members arranged inside the protective member 60.

The protective member 60 has, for example, a tubular connection tube portion 61 connected to the outer circumference of the corrugated tube 40, a tubular connection tube portion 62 connected to the outer circumference of the corrugated tube 50, and a main body tube portion 63 provided between the connection tube portion 61 and the connection tube portion 62. The main body tube portion 63 is formed so as to protrude outward in the radial direction relative to the outer circumference of the other portions, that is, the connection tube portions 61 and 62. The main body tube portion 63 is formed, for example, so as to protrude outward in the radial direction relative to the connection tube portions 61 and 62 over the entire circumference in the circumferential direction of the connection tube portions 61 and 62. The outer circumferential dimension of the main body tube portion 63 is formed to be larger than the outer circumferential dimension of the connection tube portions 61 and 62, for example. The protective member 60 is, for example, a single component in which the connection tube portion 61, the main body tube portion 63, and the connection tube portion 62 are formed continuously in one piece. The connection tube portions 61 and 62 and the main body tube portion 63 of the present embodiment are formed continuously over the entire circumference in the circumferential direction, and are formed in an endless structure in which the start point and the end point coincide with each other. In other words, no slit extending along the length direction of the wires 20 is formed in the connection tube portions 61 and 62 and the main body tube portion 63 of the present embodiment.

In the protective member 60, for example, the connection tube portion 61 is fitted to the outer circumference of the corrugated tube 40, and the connection tube portion 62 is fitted to the outer circumference of the corrugated tube 50.

The connection tube portion 61 is formed in a cylindrical shape having a size that can be fitted to the outer circumference of the corrugated tube 40, for example. The connection tube portion 61 of the present embodiment is formed in a cylindrical shape. On the inner circumferential surface of the end portion of the connection tube portion 61, for example, one or a plurality of (here, four) lips 61A that are locked to the corrugated tube 40 are formed. Each lip 61A is formed continuously over the entire circumference of the inner circumferential surface of the connection tube portion 61, for example, and is formed in an endless structure. Each lip 61A is formed so as to enter, for example, a ring-shaped recess 42 of the corrugated tube 40 when the connection tube portion 61 is fitted to the outer circumference of the corrugated tube 40.

For example, a coupling member 65 is provided on the outer circumferential surface of the connection tube portion 61. As the coupling member 65, for example, a cable tie made of resin or metal, a caulking ring, a tape member, or the like can be used. The connection tube portion 61 is fastened from the outer circumferential side by the coupling member 65 and is fixed to the corrugated tube 40. For example, the connection tube portion 61 is fastened from the outer circumferential side by the coupling member 65 until it is in close contact with the corrugated tube 40 in a liquid-tight manner. As a result, it is possible to prevent water from entering the inside of the protective member 60 from between the connection tube portion 61 and the corrugated tube 40.

The connection tube portion 62 is formed in a cylindrical shape having a size that can be fitted to the outer circumference of the corrugated tube 50, for example. The connection tube portion 62 of the present embodiment is formed in a cylindrical shape. On the inner circumferential surface of the end portion of the connection tube portion 62, for example, one or a plurality of (here, four) lips 62A that are locked to the corrugated tube 50 are formed. Each lip 62A is formed continuously over the entire circumference of the inner circumferential surface of the connection tube portion 62, for example, and is formed in an endless structure. Each lip 62A is formed so as to enter, for example, a ring-shaped recess 52 of the corrugated tube 50 when the connection tube portion 62 is fitted to the outer circumference of the corrugated tube 50.

For example, a coupling member 66 is provided on the outer circumferential surface of the connection tube portion 62. As the coupling member 66, for example, a cable tie made of resin or metal, a caulking ring, a tape member, or the like can be used. The connection tube portion 62 is fastened from the outer circumferential side by the coupling member 66 and is fixed to the corrugated tube 50. For example, the connection tube portion 62 is fastened from the outer circumferential side by the coupling member 66 until it is in close contact with the corrugated tube 50 in a liquid-tight manner. As a result, it is possible to suppress the entry of water into the inside of the protective member 60 from between the connection tube portion 62 and the corrugated tube 50.

For example, one end portion of the main body tube portion 63 is formed continuously in one piece with the connection tube portion 61, and the other end is formed continuously in one piece with the connection tube portion 62. The main body tube portion 63 is formed in a tubular shape having a size capable of accommodating, for example, the electromagnetic wave absorbing members 70A and 70B. The main body tubular portion 63 of the present embodiment is formed in a cylindrical shape. The main body tube portion 63 is formed so as to surround the electromagnetic wave absorbing members 70A and 70B over the entire circumference in the circumferential direction. The main body tube portion 63 is formed, for example, so as to surround the wires 20A and 20B, the electromagnetic wave absorbing members 70A and 70B, the restricting members 80A and 80B, and the braided member 90, which are exposed from the corrugated tubes 40 and 50, over the entire circumference in the circumferential direction.

Next, the actions and effects of this embodiment will be described.

(1) The wire harness 10 has the wire 20A, the ring-shaped electromagnetic wave absorbing member 70A including the through hole 71X through which the wire 20A passes, and the restricting member 80A that restricts relative movement of the electromagnetic wave absorbing member 70A with respect to the wire 20A in the length direction of the wire 20A. The wire harness 10 has the wire 20B, the ring-shaped electromagnetic wave absorbing member 70B including the through hole 71Y through which the wire 20B passes, and the restricting member 80B that restricts relative movement of the electromagnetic wave absorbing member 70B with respect to the wire 20B in the length direction of the wire 20B.

According to this configuration, the electromagnetic wave absorbing member 70A is provided on the wire 20A, and the electromagnetic wave absorbing member 70B is provided on the wire 20B. That is, the electromagnetic wave absorbing members 70A and 70B are individually provided for the wires 20A and 20B, respectively. As a result, the electromagnetic waves to be reduced in each of the electromagnetic wave absorbing members 70A and 70B can be reduced compared to the case where one electromagnetic wave absorbing member is provided for a plurality of wires. For this reason, each of the electromagnetic wave absorbing members 70A and 70B can be made compact, and the mass of each of the electromagnetic wave absorbing members 70A and 70B can be reduced compared to the case where one electromagnetic wave absorbing member is provided for a plurality of wires. As a result, if the electromagnetic wave absorbing members 70A and 70B vibrate accompanying traveling of the vehicle or the like, the loads respectively input from the electromagnetic wave absorbing members 70A and 70B to the wires 20A and 20B can be reduced. As a result, it is possible to suppress damage to the wires 20A and 20B caused by vibration of the electromagnetic wave absorbing members 70A and 70B.

(2) The electromagnetic wave absorbing member 70A was provided so as to overlap with a portion of the electromagnetic wave absorbing member 70B in a plan view from the first central axis direction in which the central axis of the through hole 71X extends. For this reason, it is possible to suppress an increase in the size of the wire harness 10.

(3) Also, the electromagnetic wave absorbing members 70A and 70B are individually provided for the wires 20A and 20B, respectively. For this reason, the shapes and installation positions of the electromagnetic wave absorbing members 70A and 70B can be individually set. As a result, the degree of freedom in the design of the wire harness 10 can be improved compared to the case where one electromagnetic wave absorbing member is provided for a plurality of wires.

(4) Inside the through hole 71X, the electromagnetic wave absorbing member 70A and the wire 20A are fixed to each other (integrated with each other) with the wire 20A in contact with the first portion 71A and arranged offset to the first portion 71A side. For this reason, even if the electromagnetic wave absorbing member 70A vibrates accompanying the traveling of the vehicle or the like, it is possible to suppress shaking of the wire 20A in the through hole 71X caused by vibration of the electromagnetic wave absorbing member 70A. For example, compared to the case where the electromagnetic wave absorbing member 70A and the wire 20A are fixed in a state where the wire 20A is not in contact with the inner circumferential surface of the through hole 71X, it is possible to suppress movement of the wire 20A in the through hole 71X caused by vibration of the electromagnetic wave absorbing member 70A. As a result, it is possible to suppress wearing of the wire 20A caused by contact with the inner circumferential surface of the through hole 71X, and it is possible to suitably suppress damage to the wire 20A caused by vibration of the electromagnetic wave absorbing member 70A. Also, since it is possible to suppress shaking of the wire 20A in the through hole 71X, it is possible to suppress the generation of abnormal noise between the electromagnetic wave absorbing member 70A and the wire 20A.

(5) Inside the through hole 71Y, the electromagnetic wave absorbing member 70B and the wire 20B are fixed to each other (integrated with each other) with the wire 20B arranged in contact with the third portion 71C and offset to the third portion 71C side. For this reason, even if the electromagnetic wave absorbing member 70B vibrates accompanying the traveling of the vehicle or the like, it is possible to suppress shaking of the wire 20B in the through hole 71Y caused by vibration of the electromagnetic wave absorbing member 70B. As a result, it is possible to suppress wearing of the wire 20B caused by contact with the inner circumferential surface of the through hole 71Y, and it is possible to suitably suppress damage to the wire 20B caused by vibration of the electromagnetic wave absorbing member 70B. Also, since it is possible to suppress shaking of the wire 20B in the through hole 71Y, it is possible to suppress the generation of abnormal noise between the electromagnetic wave absorbing member 70B and the wire 20B.

(6) The wire 20A was arranged offset to the first portion 71A side away from the wire 20B inside of the through hole 71X of the electromagnetic wave absorbing member 70A. Also, the wire 20B was arranged offset to the third portion 71C side away from the wire 20A inside the through hole 71Y of the electromagnetic wave absorbing member 70B. According to this configuration, the wire 20A and the wire 20B are arranged offset in directions away from each other inside the through holes 71X and 71Y. As a result, the electromagnetic wave absorbing member 70A and the electromagnetic wave absorbing member 70B can be largely overlapped with each other in a plan view from the first central axis direction. As a result, it is possible to suitably suppress an increase in the size of the wire harness 10.

(7) The braided member 90 that collectively surrounds the wire 20A, the electromagnetic wave absorbing member 70A, the wire 20B, and the electromagnetic wave absorbing member 70B was provided. According to this configuration, the electromagnetic waves emitted from the wire 20A can be reduced by the electromagnetic wave absorbing member 70A and the braided member 90 covering the outer circumference of the electromagnetic wave absorbing member 70A. Also, the electromagnetic waves emitted from the wire 20B can be reduced by the electromagnetic wave absorbing member 70B and the braided member 90 covering the outer circumference of the electromagnetic wave absorbing member 70B.

(8) Furthermore, since the braided member 90 is provided so as to collectively surround the electromagnetic wave absorbing member 70A and the electromagnetic wave absorbing member 70B, it is possible to reduce the number of components compared to the case where the braided member is individually provided for the electromagnetic wave absorbing members 70A and 70B.

(9) The protective member 60 covering the outer circumferences of the electromagnetic wave absorbing members 70A and 70B was provided. For this reason, the protective member 60 can be interposed between the electromagnetic wave absorbing members 70A and 70B and their peripheral components. As a result, it is possible to suppress direct contact between the electromagnetic wave absorbing members 70A and 70B and the peripheral components, and therefore it is possible to suppress damage to the electromagnetic wave absorbing members 70A and 70B caused by contact between the electromagnetic wave absorbing members 70A and 70B and the peripheral components.

Other Embodiments

The above-described embodiment can be modified and implemented as follows. The above-described embodiment and the following modified examples can be implemented in combination with each other as long as there is no technical contradiction.

In the above-described embodiment, the wire 20A was arranged in contact with the first portion 71A away from the wire 20B, and offset to the first portion 71A side inside the through hole 71X of the electromagnetic wave absorbing member 70A. Also, the wire 20B was arranged in contact with the third portion 71C away from the wire 20A, and offset to the third portion 71C side inside the through hole 71Y of the electromagnetic wave absorbing member 70B. However, the arrangement of the wires 20A and 20B is not limited to this.

Figure 4:
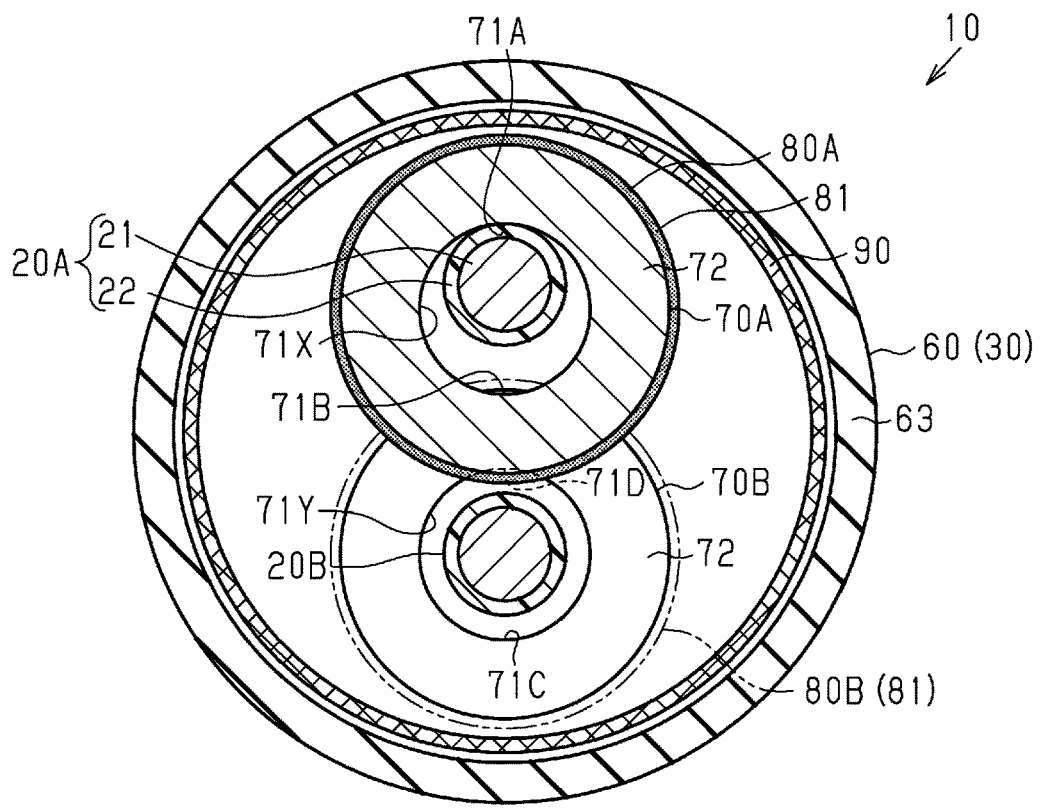
FIG. 4 is a schematic transverse cross-sectional view showing a wire harness according to a modified example.

For example, as shown in FIG. 4, the wire 20B may also not be brought into contact with the third portion 71C inside the through hole 71Y of the electromagnetic wave absorbing member 70B. For example, the wire 20B may also not be offset to the third portion 71C side inside the through hole 71Y. For example, the wire 20B may also be arranged inside the through hole 71Y near the center of the through hole 71Y.

Figure 5:
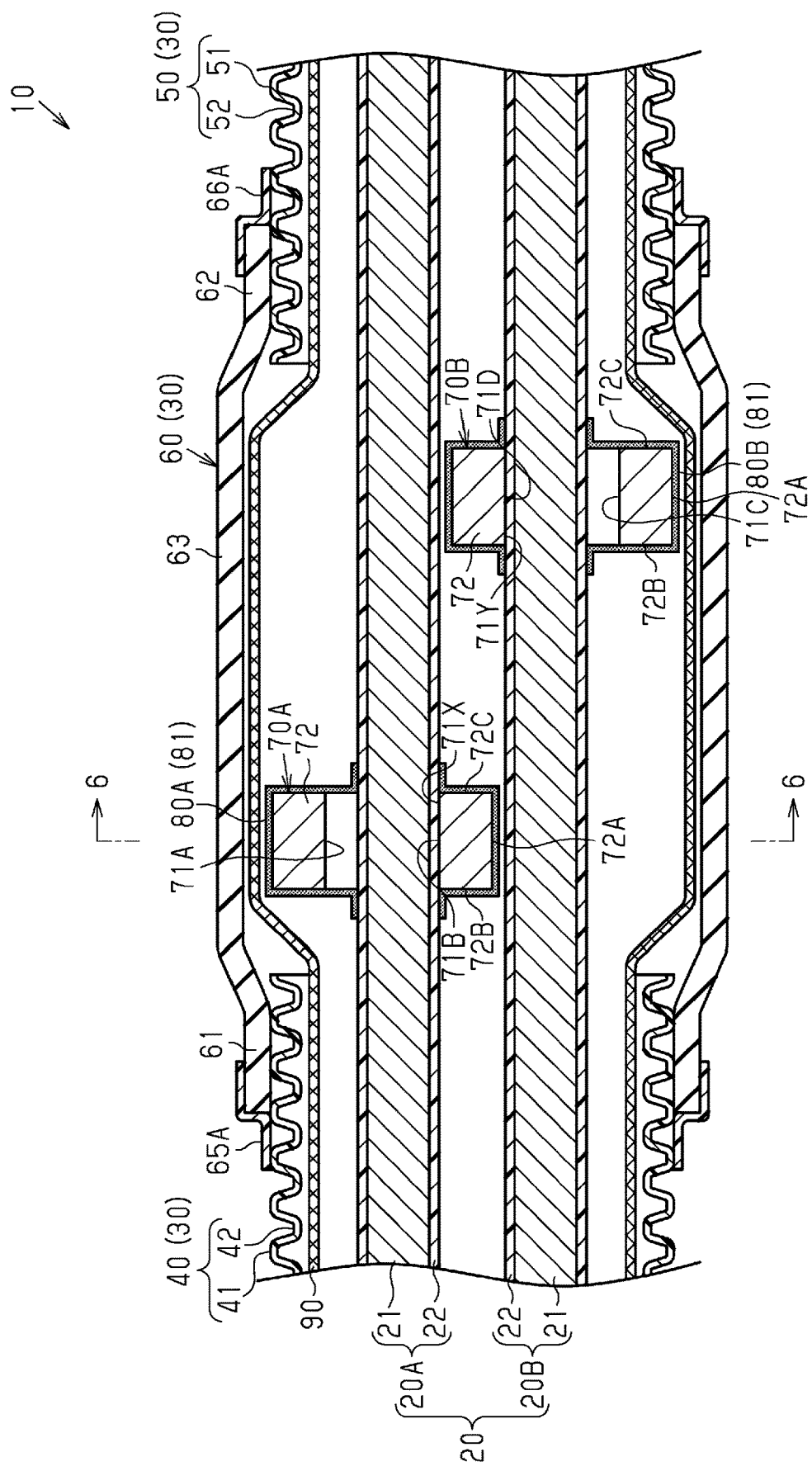
FIG. 5 is a schematic cross-sectional view showing a wire harness according to a modified example.
Figure 6:
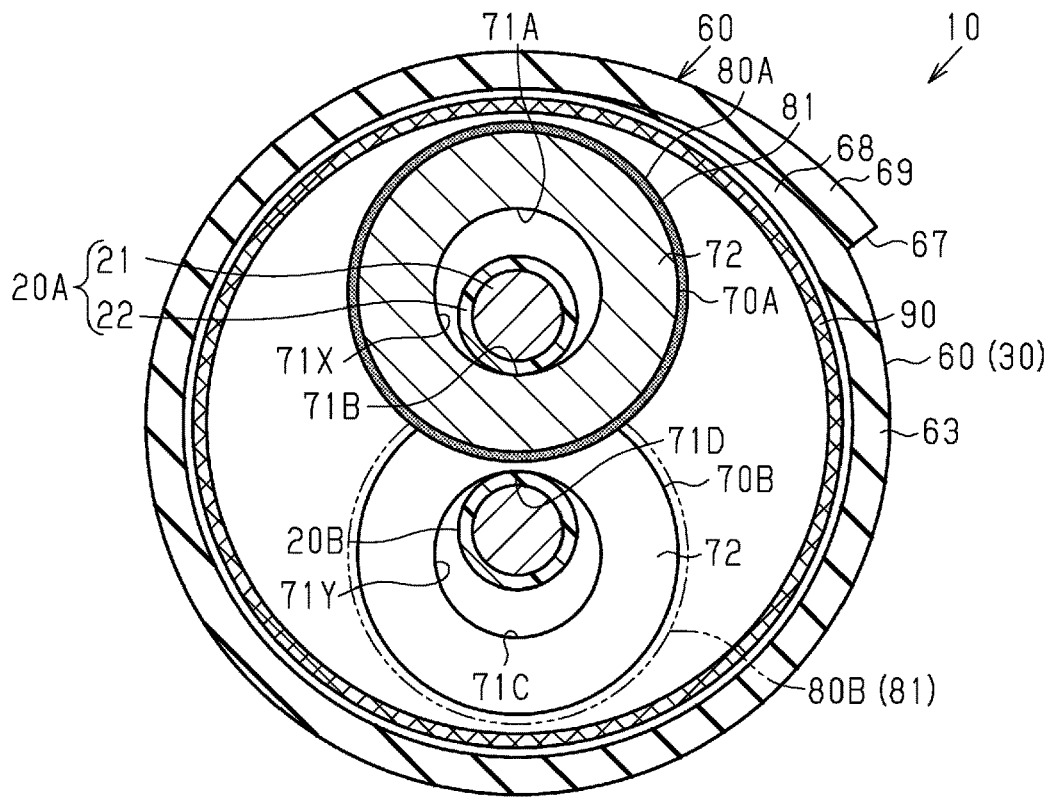
FIG. 6 is a schematic transverse cross-sectional view showing a wire harness according to a modified example.

For example, as shown in FIGS. 5 and 6, the wire 20A may also be arranged in contact with the second portion 71B and offset to the second portion 71B side inside the through hole 71X. Here, the second portion 71B is a portion provided at a position closer to the wire 20B than the first portion 71A in the direction intersecting the first central axis direction of the electromagnetic wave absorbing member 70A. That is, the wire 20A may be arranged offset toward the second portion 71B, which is closer to the wire 20B than the first portion 71A, inside the through hole 71X.

Furthermore, the wire 20B may be arranged in contact with the fourth portion 71D and offset to the fourth portion 71D side inside the through hole 71Y. Here, the fourth portion 71D is a portion provided at a position closer to the wire 20A than the third portion 71C in the direction intersecting the second central axis direction of the electromagnetic wave absorbing member 70B. That is, the wire 20B may be arranged offset toward the fourth portion 71D, which is closer to the wire 20A than the third portion 71C, inside the through hole 71Y.

According to this configuration, the wire 20A and the wire 20B can be brought close to each other. For this reason, for example, it is possible to reduce the size of the wire harness 10 at the portion where the electromagnetic wave absorbing members 70A and 70B are not provided. For example, the inner circumferential dimension and the outer circumferential dimension of the corrugated tubes 40 and 50 shown in FIG. 5 can be reduced.

Figure 7:
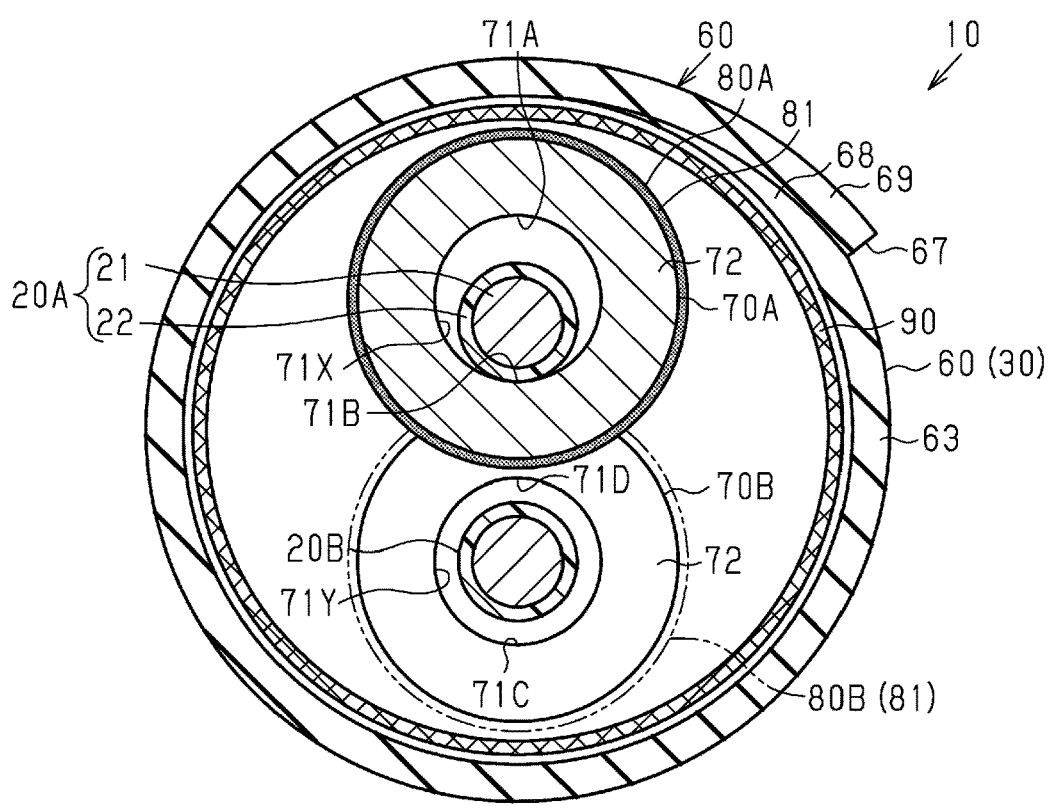
FIG. 7 is a schematic transverse cross-sectional view showing a wire harness according to a modified example.

For example, as shown in FIG. 7, inside the through hole 71X, the wire 20A may be arranged offset toward the second portion 71B, which is closer to the wire 20B, and the wire 20B may also not be brought into contact with the fourth portion 71D inside the through hole 71Y. For example, the wire 20B may also not be offset toward the fourth portion 71D inside the through hole 71Y. For example, the wire 20B may also be arranged near the center of the through hole 71Y inside the through hole 71Y.

For example, in the modified example shown in FIG. 7, for example, the wire 20A may be arranged so as not to come into contact with the inner circumferential surface of the through hole 71X, inside the through hole 71X. For example, the wire 20A may not be offset toward the second portion 71B inside the through hole 71X. For example, the wire 20A may be arranged near the center of the through hole 71X inside the through hole 71X.

In the above-described embodiment, the protective member 60 was embodied in an endless structure, but there is no limitation to this. That is, in the above-described embodiment, the protective member 60 was embodied as already being formed as a cylinder in the state before the electromagnetic wave absorbing members 70A and 70B are arranged inside, but there is no limitation to this.

For example, as shown in FIG. 6, the protective member 60 may be embodied in a sheet-like structure having a slit 67 extending along the length direction of the wires 20A and 20B. The protective member 60 of this modified example is formed so as to have a tubular shape, for example, by winding a single flexible sheet in the circumferential direction of the wires 20A and 20B. For example, the protective member 60 has an end portion 68 in the first direction (in FIG. 6, the circumferential direction of the wires 20A and 20B) intersecting the length direction of the wires 20A and 20B, and an end portion 69 on the side opposite to the end portion 68 in the first direction. The protective member 60 is formed so as to have a tubular shape, for example, by overlapping the end portion 68 and the end portion 69 in the radial direction of the electromagnetic wave absorbing members 70A and 70B. The inner circumferential dimension of the protective member 60 can be adjusted to match the outer circumferential dimension of the electromagnetic wave absorbing members 70A and 70B by, for example, adjusting the overlapping width between the end portion 68 and the end portion 69. The protective member 60 has elasticity capable of returning from, for example, a tubular state of being able to surround the outer circumferences of the electromagnetic wave absorbing members 70A and 70B to a sheet state of not surrounding the outer circumference of the electromagnetic wave absorbing members 70A and 70B.

The protective member 60 is fixed to the outer circumference of the corrugated tubes 40 and 50 by, for example, the coupling members 65 and 66 shown in FIG. 2, whereby the tubular state is maintained. As the coupling members 65 and 66, for example, tape members, cable ties, caulking bands, or the like can be used.

Next, a configuration used when tape members 65A and 66A are used as the connecting members 65 and 66 will be described with reference to FIG. 5.

The tape member 65A is formed, for example, so as to fix the end portion of the protective member 60 in the length direction to the outer circumferential surface of the corrugated tube 40. The tape member 66A is formed, for example, so as to fix the end portion in the length direction of the protective member 60 to the outer circumferential surface of the corrugated tube 50.

The tape member 65A is wound, for example, over the outer circumferential surface of the end portion in the length direction of the protective member 60 and the outer circumferential surface of the corrugated tube 40 exposed from the protective member 60. The tape member 65A is continuously wound around the range from the outer circumferential surface of the protective member 60 to the outer circumferential surface of the corrugated tube 40, for example. The tape member 65A has, for example, an overlap winding structure. The tape member 65A is wound around the outer circumference of the end portion of the protective member 60 such that the tubular state of the protective member 60 is maintained, for example.

The tape member 66A is wound, for example, over the outer circumferential surface of the end portion in the length direction of the protective member 60 and the outer circumferential surface of the corrugated tube 50 exposed from the protective member 60. The tape member 66A is continuously wound around the range from the outer circumferential surface of the protective member 60 to the outer circumferential surface of the corrugated tube 50, for example. The tape member 66A has, for example, an overlap winding structure. The tape member 66A is wound around the outer circumference of the end portion of the protective member 60 such that the tubular state of the protective member 60 is maintained, for example.

An adhesive layer or a pressure-sensitive adhesive layer may be provided on one surface of the protective member 60 shown in FIG. 6. For example, an adhesive layer or a pressure-sensitive adhesive layer may be provided on one surface of the end portion 69 of the protective member 60. According to this configuration, if the end portion 69 is overlapped with the end portion 68 of the protective member 60, the end portion 69 can be adhered to the end portion 68 by the adhesive layer or the pressure-sensitive adhesive layer. As a result, it is possible to suitably suppress a case in which the protective member 60 returns to the sheet state in a stage prior to being fixed by the tape members 65A and 66A (see FIG. 5).

For example, a material with more excellent impact resistance and a more excellent cushioning property than the corrugated tubes 40 and 50 can also be used as the material of the protective member 60 of the above-described embodiment. For example, as the material of the protective member 60, for example, a material having more excellent sound absorption than the corrugated tubes 40 and 50 can be used. As the material of such a protective member 60, for example, a porous material can be used. As the material of the protective member 60, for example, a foamed resin can be used. The bubble structure in the foamed resin may be an open cell structure or a closed cell structure. As the material of the protective member 60, for example, urethane foam, polyethylene foam, ethylene-propylene-diene rubber foam, or the like can be used. By using the material as described above as the material of the protective member 60, the protective member 60 can function as a cushioning member.

According to this configuration, the protective member 60 serving as a cushioning member (cushion) can be interposed between the electromagnetic wave absorbing members 70A and 70B and their peripheral components. As a result, it is possible to suppress the generation of abnormal noise caused by contact between the electromagnetic wave absorbing members 70A and 70B and their peripheral components.

Figure 8:
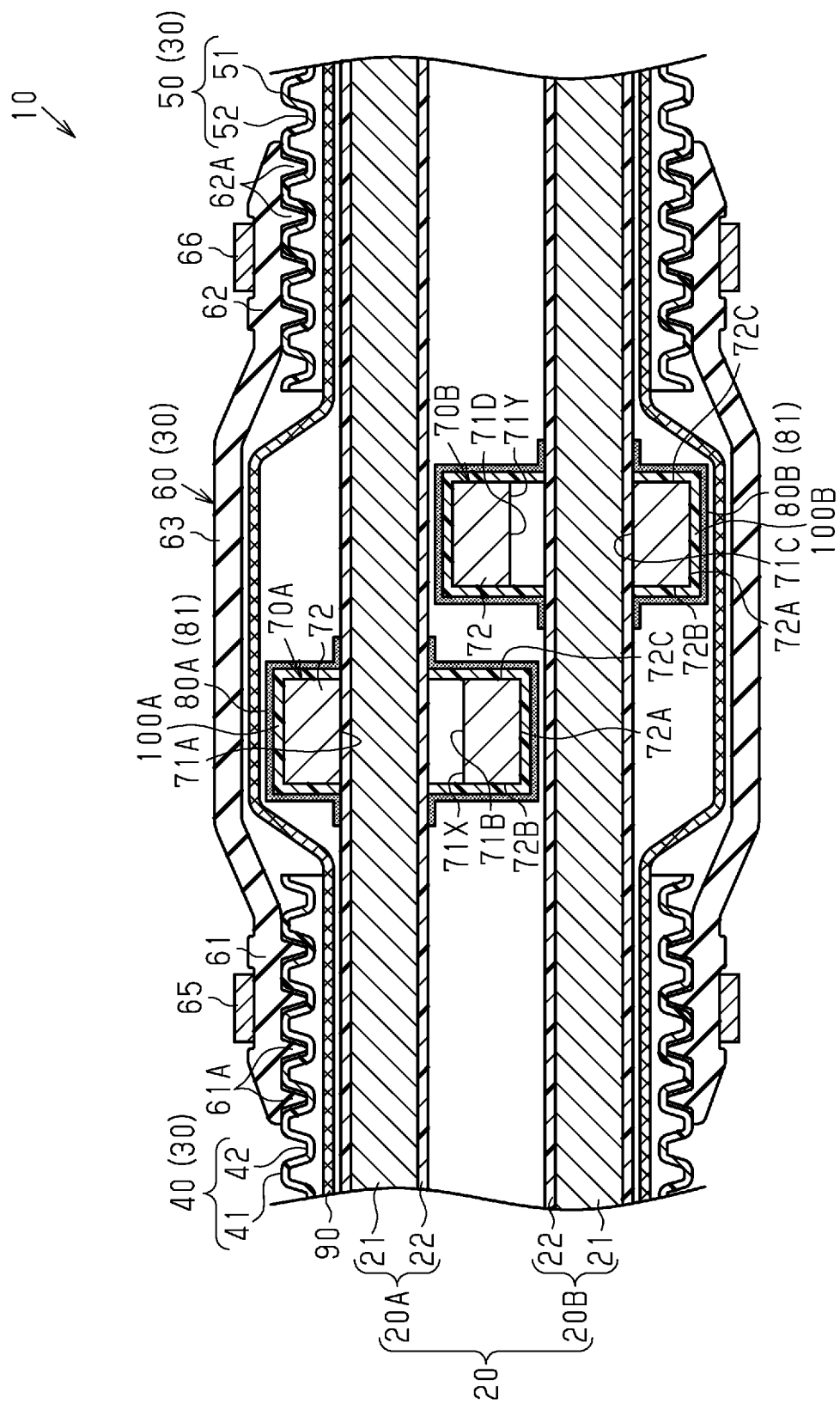
FIG. 8 is a schematic transverse cross-sectional view showing a wire harness according to a modified example.

For example, as shown in FIG. 8, a cushioning member 100A that covers the outer circumference of the electromagnetic wave absorbing member 70A may be provided. Also, a cushioning member 100B that covers the outer circumference of the electromagnetic wave absorbing member 70B may be provided. As the material of the cushioning members 100A and 100B, for example, a material having more excellent impact resistance and a more excellent cushioning property than the corrugated tubes 40 and 50 can be used. For example, as the material of the cushioning members 100A and 100B, for example, a material having more excellent sound absorption than the corrugated tubes 40 and 50 can be used. As the material of such cushioning members 100A and 100B, for example, a porous material can be used. As the material of the cushioning members 100A and 100B, for example, foamed resin can be used. The bubble structure in the foamed resin may be an open cell structure or a closed cell structure. As the material of the cushioning members 100A and 100B, for example, urethane foam, polyethylene foam, ethylene-propylene-diene rubber foam, or the like can be used.

The cushioning member 100A of this modified example is formed so as to cover the entire outer surface of the electromagnetic wave absorbing member 70A, that is, the entire outer circumferential surface 72A and the entire side surfaces 72B and 72C. The cushioning member 100B of this modified example is formed so as to cover the entire outer surface of the electromagnetic wave absorbing member 70B, that is, the entire outer circumferential surface 72A and the entire side surfaces 72B and 72C. At this time, the restricting member 80A is continuously wound around the range from the outer circumferential surface of the cushioning member 100A to the outer circumferential surface of the wire 20A, for example. The restricting member 80B is continuously wound around the range from the outer circumferential surface of the cushioning member 100B to the outer circumferential surface of the wire 20B, for example.

According to this configuration, the cushioning members 100A and 100B can be interposed between the electromagnetic wave absorbing member 70A and the electromagnetic wave absorbing member 70B in the length direction of the wires 20A and 20B. As a result, it is possible to suppress direct contact between the electromagnetic wave absorbing member 70A and the electromagnetic wave absorbing member 70B, and therefore it is possible to suppress damage to the electromagnetic wave absorbing members 70A and 70B caused by contact between the electromagnetic wave absorbing member 70A and the electromagnetic wave absorbing member 70B. For this reason, the electromagnetic wave absorbing member 70A and the electromagnetic wave absorbing member 70B can be arranged close to each other in the length direction of the wires 20A and 20B. For example, in the illustrated example, the distance between the electromagnetic wave absorbing member 70A and the electromagnetic wave absorbing member 70B is set to be shorter than the length dimension of the electromagnetic wave absorbing member 70A.

In the modified example shown in FIG. 8, the cushioning member 100A may be formed so as to cover only the side surface 72C facing the electromagnetic wave absorbing member 70B in the outer surface of the electromagnetic wave absorbing member 70A.

In the modified example shown in FIG. 8, the cushioning member 100B may be formed so as to cover only the side surface 72B facing the electromagnetic wave absorbing member 70A side of the outer surface of the electromagnetic wave absorbing member 70B.

In the modified example shown in FIG. 8, the cushioning member 100B may be omitted.

Figure 9:
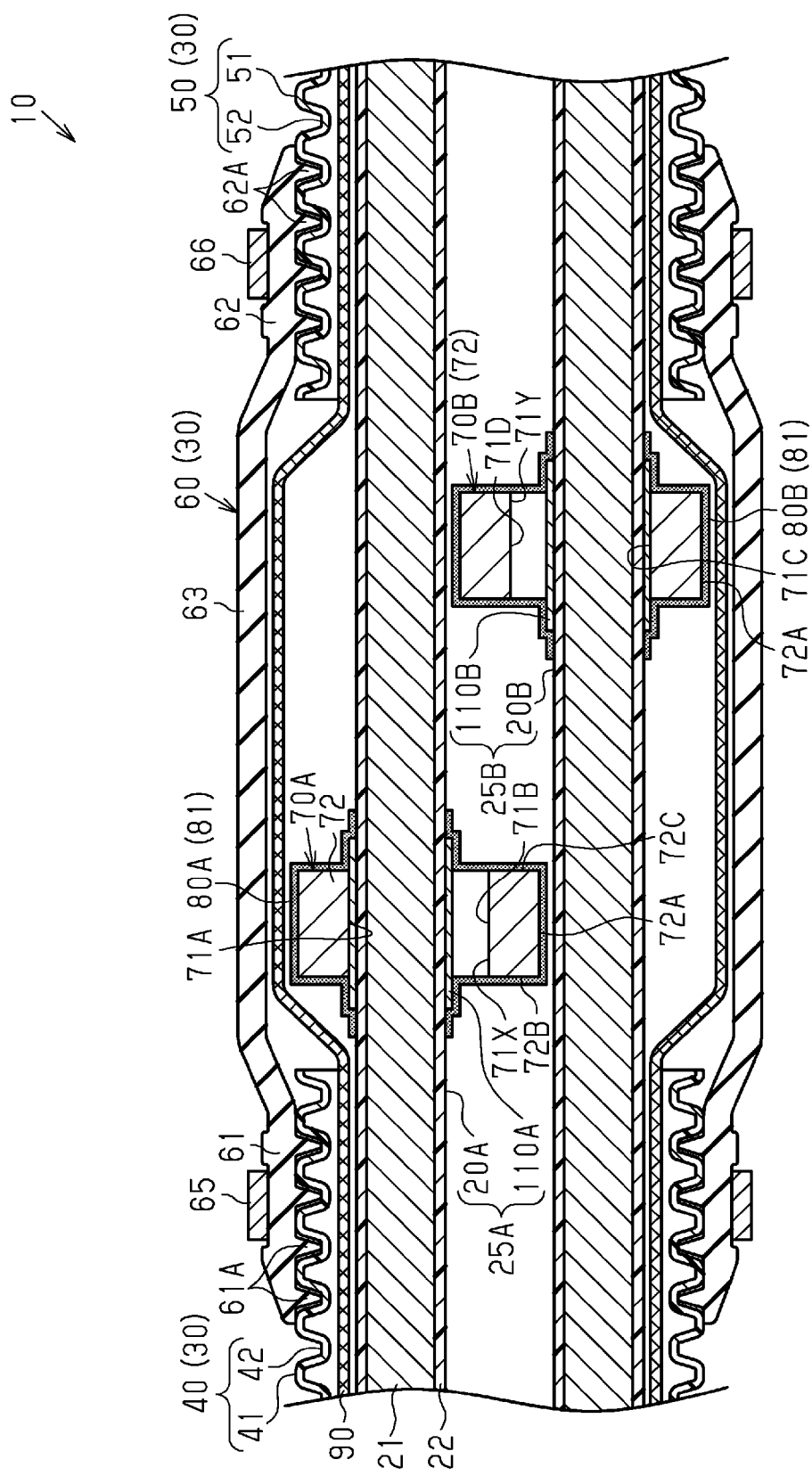
FIG. 9 is a schematic transverse cross-sectional view showing a wire harness according to a modified example.

In the above-described embodiment, the first wire member is constituted by only the wire 20A, and the second wire member is constituted by only the wire 20B. There is no limitation to this, and for example, as shown in FIG. 9, the wire member 25A may also be constituted by the wire 20A and the covering member 110A surrounding the outer circumference of the wire 20A. Also, the wire member 25B may be constituted by the wire 20B and the covering member 110B surrounding the outer circumference of the wire 20B.

The covering member 110A is formed so as to cover the outer circumference of the wire 20A at the portion passing through the through hole 71X of the electromagnetic wave absorbing member 70A, for example. The covering member 110B is formed so as to cover the outer circumference of the wire 20B at a portion passing through the through hole 71Y of the electromagnetic wave absorbing member 70B, for example. The covering members 110A and 110B are provided so as to surround the outer circumferences of the wires 20A and 20B located between the corrugated tube 40 and the corrugated tube 50, respectively, for example. The covering members 110A and 110B are provided so as to surround the outer circumference of each of the wires 20A and 20B over the entire circumference in the circumferential direction, for example. The covering members 110A and 110B are exposed from both of the corrugated tubes 40 and 50, for example.

The covering member 110A is provided so as to pass through the through hole 71X of the electromagnetic wave absorbing member 70A while surrounding the outer circumference of the wire 20A, for example. The covering member 110B is provided so as to pass through the through hole 71Y of the electromagnetic wave absorbing member 70B while surrounding the outer circumference of the wire 20B, for example.

The outer circumferential dimensions of the covering members 110A and 110B are set smaller than, for example, the inner circumferential dimensions of the through holes 71X and 71Y of the electromagnetic wave absorbing members 70A and 70B. The outer circumferential dimensions of the covering members 110A and 110B are set smaller than, for example, the inner circumferential dimensions of the corrugated tubes 40 and 50. Note that one end portion in the length direction of the covering members 110A and 110B may be accommodated in, for example, the internal space of the corrugated tube 40, and the other end in the length direction may be accommodated in the internal space of the corrugated tube 50.

The covering members 110A and 110B are not particularly limited as long as they are outer cover members capable of covering the outer circumference of the wires 20A and 20B. For example, as the covering members 110A and 110B, corrugated tubes, twist tubes and tape members can be used. The corrugated tube in this case may have a slit extending along the length direction of the wires 20A and 20B, or may have no slit.

The restricting member 80A of this modified example is, for example, continuously wound over a range from the outer circumferential surface 72A of the electromagnetic wave absorbing member 70A to the outer circumferential surface of the wire 20A via the outer circumferential surface of the covering member 110A. The restricting member 80B of this modified example is, for example, continuously wound over a range from the outer circumferential surface 72A of the electromagnetic wave absorbing member 70B to the outer circumferential surface of the wire 20B via the outer circumferential surface of the covering member 110B.

According to the configuration described above, the covering members 110A and 110B that cover the outer circumferences of the wires 20A and 20B are provided, and the wires 20A and 20B are passed through the through holes 71X and 71Y in a state of being covered by the covering members 110A and 110B, respectively. For this reason, it is possible to suppress direct contact between the inner circumferential surfaces of the through holes 71X and 71Y and the outer circumferential surfaces of the wires 20A and 20B. As a result, it is possible to suitably suppress damage to the wires 20A and 20B caused by contact with the inner circumferential surfaces of the through holes 71X and 71Y.

In the modified example shown in FIG. 9, the tape member 81 of the restricting member 80A was wound so as to cover the end portion in the length direction of the covering member 110A, but there is no limitation to this. That is, in the above-described modification, the tape member 81 of the restricting member 80A was formed so as to be continuously wound around the range from the outer circumferential surface of the electromagnetic wave absorbing member 70A to the outer circumferential surface of the wire 20A, but there is no limitation to this. For example, the tape member 81 of the restricting member 80A may be wound so as to expose the end portion in the length direction of the covering member 110A. That is, the tape member 81 of the restricting member 80A may be formed so as to be continuously wound around the range from the outer circumferential surface of the electromagnetic wave absorbing member 70A to the outer circumferential surface of the covering member 110A. Note that the tape member 81 of the restricting member 80B can be changed in the same manner.

Figure 10:
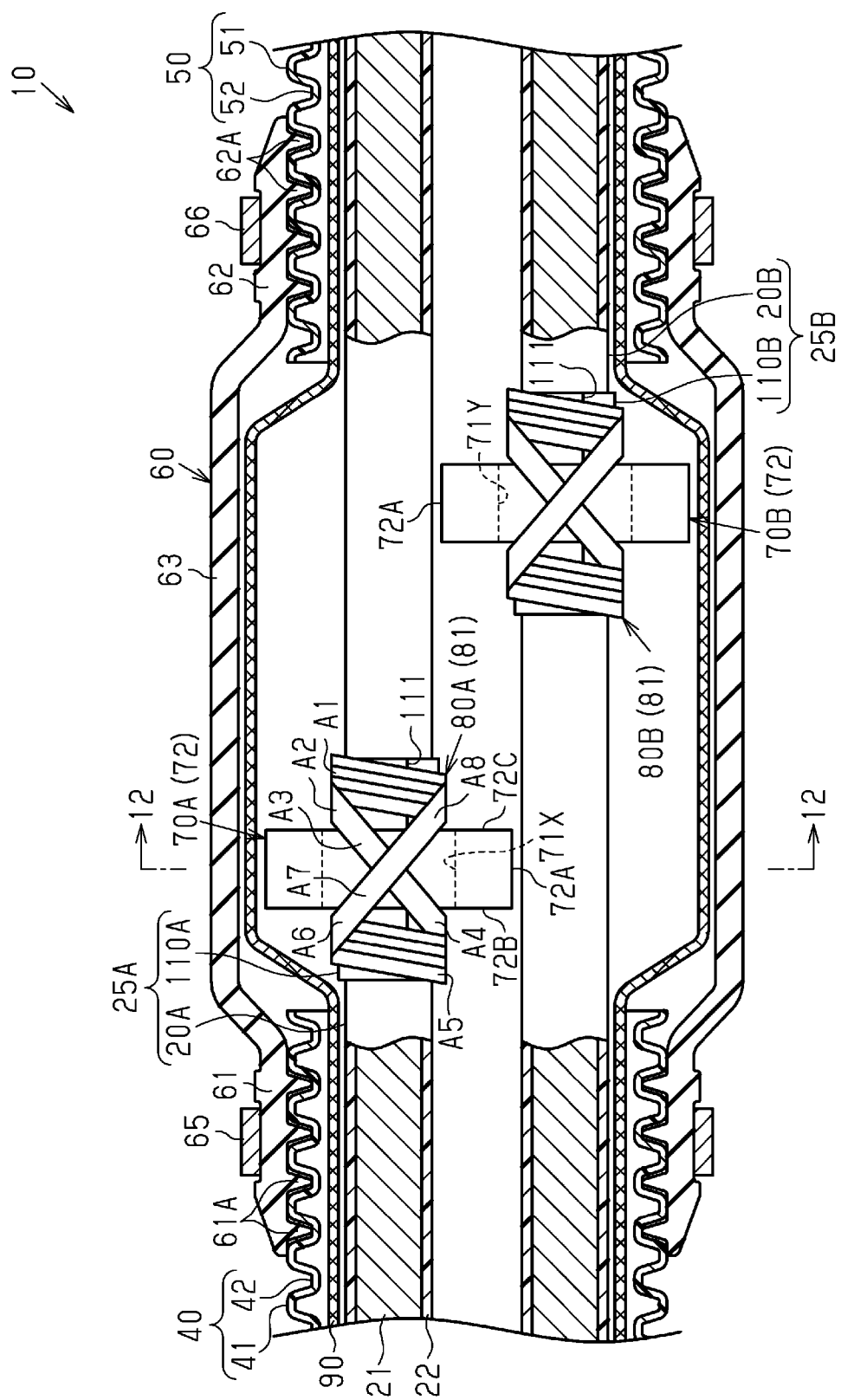
FIG. 10 is a schematic cross-sectional view showing a wire harness according to a modified example.
Figure 11:
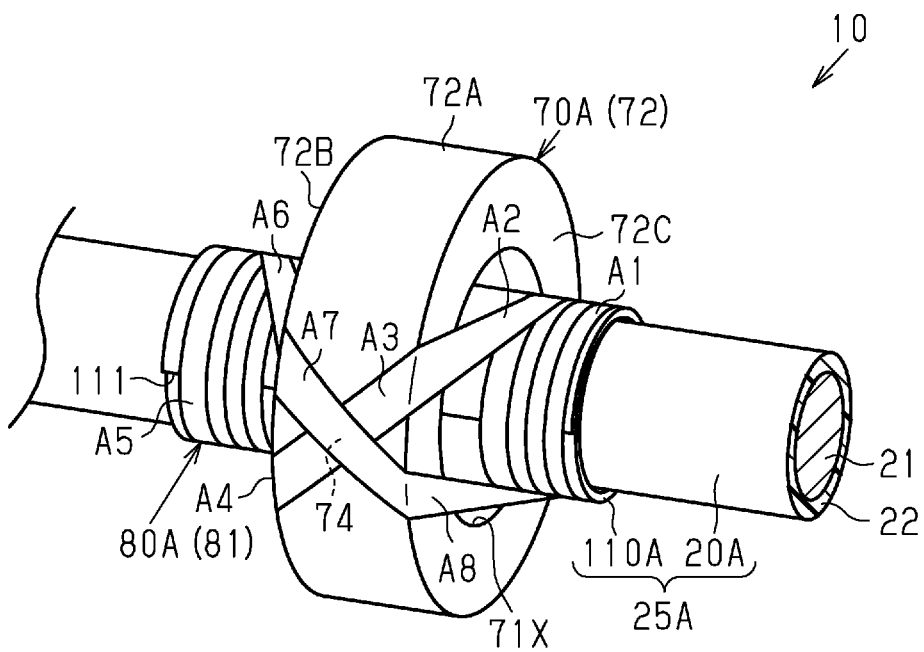
FIG. 11 is a schematic perspective view showing a wire harness according to a modified example.
Figure 12:
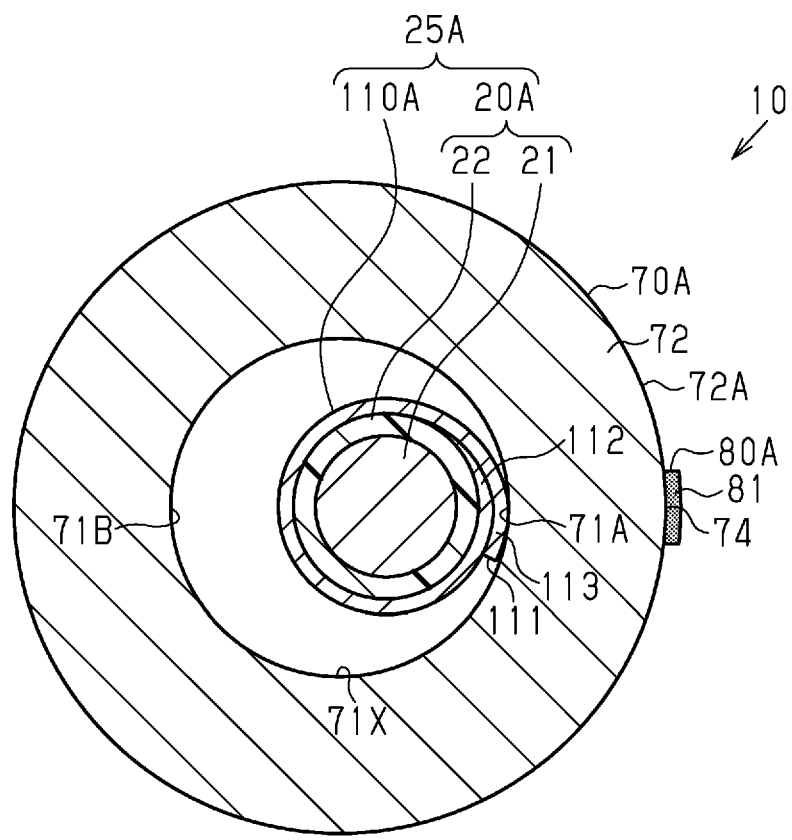
FIG. 12 is a schematic transverse cross-sectional view (a cross-sectional view taken along line 12-12 in FIG. 10) showing a wire harness according to a modified example.

As shown in FIGS. 10 to 12, the covering member 110A may be formed into a sheet shape having a slit 111 that extends along the length direction of the wire 20A. The covering member 110A of this modified example is formed so as to have a cylindrical shape, for example, by winding a flexible resin sheet in the circumferential direction of the wire 20A.

As shown in FIG. 12, the covering member 110A has, for example, an end portion 112 in a second direction (in FIG. 12, the circumferential direction of the wire 20A) intersecting the length direction of the wire 20A, and the end portion 113 on the side opposite to the end portion 112 in the second direction. The covering member 110A is formed so as to have a tubular shape, for example, by overlapping the end portion 112 and the end portion 113 in the radial direction of the wire 20A. The inner circumferential dimension of the covering member 110A can be adjusted to match the outer circumferential dimension of the wire 20A by, for example, adjusting the overlapping width between the end portion 112 and the end portion 113. The covering member 110A has elasticity according to which it is possible to return from a tubular state of being able to surround the outer circumference of the wire 20A to a sheet state of not surrounding the outer circumference of the wire 20A, for example.

As the material of the covering member 110A, a resin material having no conductivity is used. As the resin material, for example, synthetic resins such as polyethylene terephthalate, polyolefin, polyamide, polyester, and ABS resin can be used. As the covering member 110A, for example, a twist tube can be used. The twist tube is made of, for example, a woven fabric made of polyethylene terephthalate or polyester. The twist tube is formed by, for example, weaving resin fibers, and has a mesh.

Similarly, the covering member 110B may be formed in a sheet shape having a slit 111 extending along the length direction of the wire 20B.

According to this configuration, by overlapping the end portion 113 on the end portion 112 of the sheet-shaped covering member 110A, the covering member 110A can be formed so as to have a tubular shape that surrounds the outer circumference of the wire 20A over the entire circumference in the circumferential direction. For this reason, the covering member 110A can be easily attached to the wire 20A later. As a result, the assembly workability of the wire harness 10 can be improved.

In the above-described embodiment, the restricting member 80A was formed by winding the tape member 81 so as to cover the entire outer circumferential surface of the electromagnetic wave absorbing member 70A. For example, the restricting member 80A may also be formed by winding the tape member 81 so as to cover only a portion of the outer circumferential surface of the electromagnetic wave absorbing member 70A.

For example, as shown in FIG. 10, the restricting member 80A of this modified example integrally includes, for example, eight regions A1 to A8. The region A1 is a region in which the tape member 81 is wound around the wire member 25A at the portion led out from the through hole 71X of the electromagnetic wave absorbing member 70A to the corrugated tube 50 side. In the region A1, for example, the tape member 81 is wound a plurality of times around the entire circumference in the circumferential direction of the covering member 110A surrounding the outer circumference of the wire 20A. The tape member 81 in the region A1 has, for example, a function of suppressing the return of the covering member 110A to the sheet state, that is, a function of keeping the covering member 110A in a tubular state. The tape member 81 in the region A1 has, for example, an overlap winding structure.

As shown in FIG. 11, the region A2 is a region connected to the region A1. The region A2 is, for example, a region in which the tape member 81 extends, in state of being tensioned with a tensile force, from the outer circumferential surface of the covering member 110A toward the outer circumferential surface 72A of the magnetic core 72 of the electromagnetic wave absorbing member 70A. The tape member 81 in the region A2 is provided so as to bridge between the outer circumferential surface of the covering member 110A and the outer circumferential surface 72A of the magnetic core 72. The tape member 81 in the region A2 is provided, for example, so as to oppose the side surface 72C of the magnetic core 72.

The region A3 is a region connected to the region A2. The region A3 is, for example, a region in which the tape member 81 is wound around the outer circumferential surface 72A of the magnetic core 72. The tape member 81 in the region A3 covers, for example, a portion of the outer circumferential surface 72A of the magnetic core 72. The tape member 81 in the region A3 is adhered to, for example, a portion of the outer circumferential surface 72A of the magnetic core 72.

As shown in FIG. 10, the region A4 is a region connected to the region A3. The region A4 is, for example, a region in which the tape member 81 extends, in a state of being tensioned with a tensile force, from the outer circumferential surface 72A of the magnetic core 72 toward the outer circumferential surface of the covering member 110A at the portion led out from the through hole 71X of the electromagnetic wave absorbing member 70A to the corrugated tube 40 side. The tape member 81 in the region A4 is provided so as to bridge between the outer circumferential surface 72A of the magnetic core 72 and the outer circumferential surface of the covering member 110A. The tape member 81 in the region A4 is provided, for example, so as to oppose the side surface 72B of the magnetic core 72.

The tape member 81 in the regions A2 to A4 is formed, for example, so as to intersect in the circumferential direction of the magnetic core 72 and to extend in an inclined manner so as to intersect in the length direction of the wire 20A. In the tape member 81 shown in FIG. 10, the starting end of the region A2 is located on the upper side in the drawing, and extends so as to incline downward in the drawing from the starting end of the region A2 toward the terminal end of the region A4.

The region A5 is a region connected to the region A4. The region A5 is a region in which the tape member 81 is wound around the wire member 25A at the portion led out from the through hole 71X of the electromagnetic wave absorbing member 70A to the corrugated tube 40 side. In the region A5, for example, the tape member 81 is wound a plurality of times around the entire circumference in the circumferential direction with respect to the covering member 110A surrounding the outer circumference of the wire 20A. The tape member 81 in the region A5 has, for example, a function of maintaining the covering member 110A in a tubular state. The tape member 81 in the region A5 has, for example, an overlap winding structure.

The region A6 is a region connected to the region A5. The region A6 is, for example, a region in which the tape member 81 extends, in a state of being tensioned with a tensile force, from the outer circumferential surface of the covering member 110A toward the outer circumferential surface 72A of the magnetic core 72. The tape member 81 in the region A6 is provided so as to bridge between the outer circumferential surface of the covering member 110A and the outer circumferential surface 72A of the magnetic core 72. The tape member 81 in the region A6 is provided, for example, so as to oppose the side surface 72B of the magnetic core 72.

The region A7 is a region connected to the region A6. The region A7 is, for example, a region in which the tape member 81 is wound around the outer circumferential surface 72A of the magnetic core 72. The tape member 81 in the region A7 is formed so as to intersect the tape member 81 in the region A3, for example. The tape member 81 in the region A7 covers, for example, a portion of the outer circumferential surface 72A of the magnetic core 72. The tape member 81 in the region A7 adheres to, for example, a portion of the outer circumferential surface 72A of the magnetic core 72 and adheres to a portion of the tape member 81 in the region A3.

The region A8 is a region connected to the region A7. The region A8 is, for example, a region in which the tape member 81 extends, in a state of being tensioned with a tensile force, from the outer circumferential surface 72A of the magnetic core 72 toward the region A1. The tape member 81 in the region A8 is provided so as to bridge between the outer circumferential surface 72A of the magnetic core 72 and the outer circumferential surface of the covering member 110A. The tape member 81 in the region A8 is provided, for example, so as to oppose the side surface 72C of the magnetic core 72.

The tape member 81 in the regions A6 to A8 is formed, for example, so as to intersect in the circumferential direction of the magnetic core 72 and to extend in an inclined manner so as to intersect in the length direction of the wire 20A. The tape member 81 in the regions A6 to A8 is formed so as to intersect the tape member 81 in the regions A2 to A4, for example. The tape member 81 in the regions A6 to A8 is formed so as to overlap with portions of the tape member 81 in the regions A2 to A4, for example. In the tape member 81 shown in FIG. 10, the starting end of the region A6 is located on the upper side in the drawing, and the tape member 81 extends toward the lower portion in the drawing from the starting end of the region A6 toward the terminal end of the region A8.

As shown in FIGS. 11 and 12, the tape member 81 is formed so as to adhere to, for example, the outer circumferential surface 72A of the magnetic core 72 in only a partial region 74 of the outer circumferential surface 72A. The tape member 81 is formed, for example, so as to adhere to only a region 74 that is smaller than half of the entire outer circumferential surface 72A of the magnetic core 72. The tape member 81 is formed, for example, so as to adhere to only a region 74 that is smaller than one-fourth of the entire outer circumferential surface 72A of the magnetic core 72. The tape member 81 is formed, for example, so as to adhere to only a region 74 that is smaller than one-fourth of the entire circumference in the circumferential direction of the outer circumferential surface 72A of the magnetic core 72.

At this time, as shown in FIG. 12, the tape member 81 may also be wound around the outer circumferential surfaces of the electromagnetic wave absorbing member 70A and the wire member 25A such that that the wire member 25A is arranged inside of the through hole 71X of the electromagnetic wave absorbing member 70A so as to be offset to a portion in the circumferential direction of the through hole 71X. For example, the wire member 25A is in contact with the first portion 71A and is separated from the second portion 71B inside the through hole 71X. For example, a portion of the covering member 110A is in contact with the first portion 71A and is separated from the second portion 71B inside of the through hole 71X. Here, the first portion 71A with which the wire member 25A is brought into contact is provided at a position closer to the region 74, which is the outer circumferential surface of the electromagnetic wave absorbing member 70A covered by the tape member 81, than the second portion 71B in the direction intersecting the first central axis direction of the electromagnetic wave absorbing member 70A. The first portion 71A is, for example, the inner circumferential surface of the through hole 71X of the portion corresponding to the region 74 in the circumferential direction of the electromagnetic wave absorbing member 70A. For example, the first portion 71A is a portion located at the same angle as the region 74 of the outer circumferential surface 72A of the magnetic core 72 in the circumferential direction of the magnetic core 72. For example, the first portion 71A is a portion of the inner circumferential surface of the through hole 71X that is located on the underside of the region 74. The tape member 81 of this modification, for example, fixes the electromagnetic wave absorbing member 70A to the outer circumference of the wire member 25A such that the covering member 110A of the wire member 25A is arranged inside the through hole 71X so as to be in contact with the first portion 71A and offset to the first portion 71A side (region 74 side). Note that the wire member 25A is arranged, for example, offset in the same direction, that is, offset to the region 74 side, over the entire length in the first central axis direction of the through hole 71X. In other words, the tape member 81 is wound around the outer circumferential surfaces of the electromagnetic wave absorbing member 70A and the wire member 25A such that the wire member 25A is arranged offset in the same direction over the entire length in the first central axis direction of the through hole 71X.

According to this configuration, the tape member 81 is formed so as to cover only a portion in the circumferential direction of the outer circumferential surface 72A of the electromagnetic wave absorbing member 70A. This makes it possible to, for example, shorten the length of the tape member 81 compared to the case where the tape member 81 is formed so as to cover the outer circumferential surface 72A of the electromagnetic wave absorbing member 70A over the entire circumference in the circumferential direction. As a result, the manufacturing cost of the wire harness 10 can be reduced. Note that the restricting member 80B can also be modified in the same manner as the restricting member 80A.

In the above-described embodiment, the restricting members 80A and 80B were constituted by the tape member 81, but there is no limitation to this. For example, metal bands or resin cable ties may be used as the restricting members 80A and 80B.

In the above-described embodiment, the restricting member 80A was provided so as to fix the electromagnetic wave absorbing member 70A to the wire 20A, but there is no limitation to this. For example, the shape and installation position of the restricting member 80A are not particularly limited as long as the configuration can restrict relative movement of the electromagnetic wave absorbing member 70A with respect to the wire 20A in the length direction of the wire 20A. In the above-described embodiment, the restricting member 80A was formed so as to cover the outer circumferential surface of the electromagnetic wave absorbing member 70A, but the restricting member 80A may be formed so as not to surround the outer circumferential surface of the electromagnetic wave absorbing member 70A. For example, the restricting member 80A may be provided so as to be adjacent to the electromagnetic wave absorbing member 70A in the length direction of the wire 20A.

Note that the restricting member 80B can also be changed in the same manner as the restricting member 80A.

In the above-described embodiment, the first outer cover was embodied in the corrugated tube 40, and the second outer cover was embodied in the corrugated tube 50, but there is no limitation to this. For example, as the first outer cover member (first outer cover) and the second outer cover member (second outer cover), a hard resin pipe, a metal pipe, or a rubber waterproof cover can be used. For example, the first outer cover member and the second outer cover member may be embodied in mutually different types of outer cover members.

In the above-described embodiment, the outer cover member 30 was embodied in a configuration including the corrugated tubes 40 and 50 and the protective member 60, but there is no limitation to this.

Figure 13:
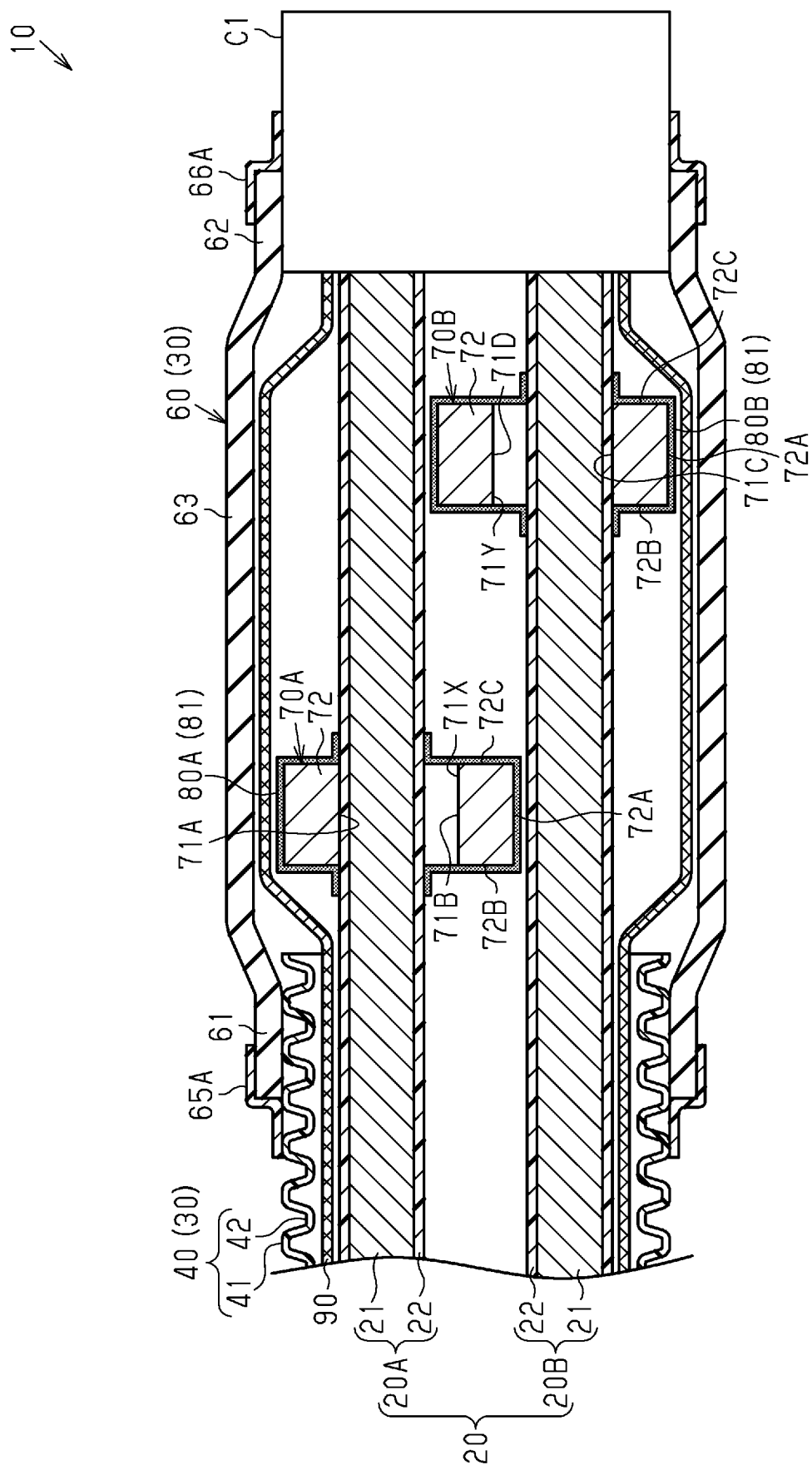
FIG. 13 is a schematic cross-sectional view showing a wire harness according to a modified example.

For example, as shown in FIG. 13, the corrugated tube 50 may be omitted from the outer cover member 30, and the outer cover member 30 may be embodied in a configuration including the corrugated tube 40 and the protective member 60. In this modified example, the electromagnetic wave absorbing members 70A and 70B are provided between the corrugated tube 40 and the connector C1. The protective member 60 is provided so as to cover the outer circumferences of the wires 20A and 20B exposed from the corrugated tube 40 and the electromagnetic wave absorbing members 70A and 70B, for example. The protective member 60 is provided so as to bridge between the outer circumference of the corrugated tube 40 and the outer circumference of the connector C1, for example. For example, the protective member 60 is fitted to the outer circumference of the connector housing (not shown) included in the connector C1.

Instead of the braided member 90 of the above-described embodiment, another electromagnetic shielding member (electromagnetic shield) such as metal foil may be used.

The braided member 90 in the above-described embodiment may also be omitted.

The wires 20A and 20B of the above-described embodiment may also be changed to shielded wires.

The wires 20A and 20B of the above-described embodiment may also be changed to low-voltage wires.

In the above-described embodiment, the electromagnetic wave absorbing members 70A and 70B were constituted by only the magnetic cores 72, but there is no limitation to this. For example, the electromagnetic wave absorbing members 70A and 70B may also be configured to include a magnetic core 72 and a case for accommodating the magnetic core 72.

There is no particular limitation to the number and installation positions of the electromagnetic wave absorbing members 70A and 70B in the above-described embodiment. For example, two or more electromagnetic wave absorbing members 70A and 70B may also be provided for one of the wires 20A and 20B. For example, the electromagnetic wave absorbing members 70A and 70B may be provided outside the vehicle interior, which is a waterproof region, or the electromagnetic wave absorbing members 70A and 70B may be provided inside the vehicle interior, which is a non-waterproof region.

In the above-described embodiment, there were two wires 20 accommodated inside the outer cover member 30, but there is no particular limitation thereto, and the number of wires 20 can be changed according to the specification of the vehicle V. For example, there may be one or three or more wires 20 accommodated inside the outer cover member 30. For example, as the wire accommodated in the outer cover member 30, a low-voltage wire for connecting a low-voltage battery and various low-voltage devices (e.g., a lamp, car audio, etc.) may be added.

The arrangement relationship between the inverter 11 and the high-voltage battery 12 in the vehicle V is not limited to the above-described embodiment, and may be appropriately changed according to the vehicle configuration.

Figure 14:
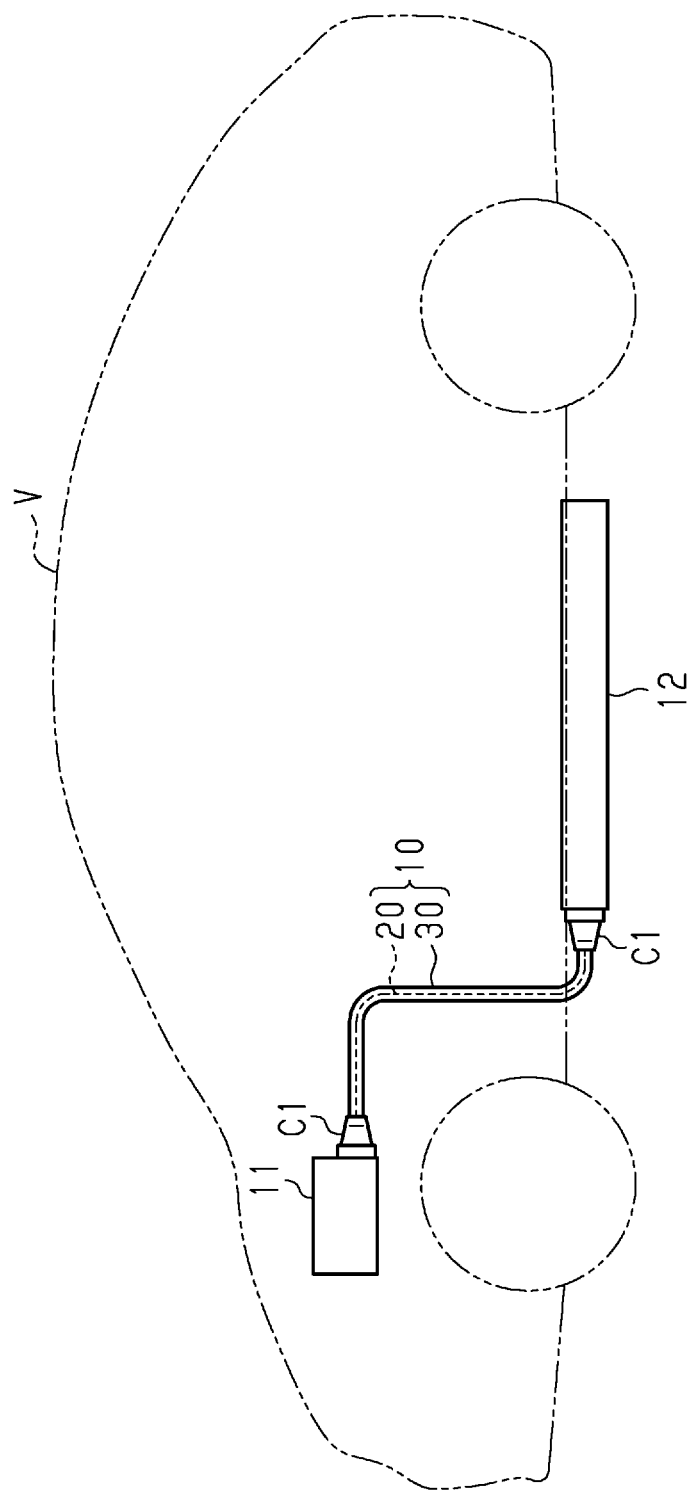
FIG. 14 is a schematic configurational diagram showing a wire harness according to a modified example.

For example, as shown in FIG. 14, the high-voltage battery 12 may be arranged on approximately the entirety of the floor of the vehicle V and may be embodied in a wire harness 10 that electrically connects the high-voltage battery 12 and the inverter 11.

In the above-described embodiment, the inverter 11 and the high-voltage battery 12 were adopted as the electric devices connected by the wire harness 10, but there is no limitation to this. For example, the present disclosure may be adopted in a wire connecting the inverter 11 and the motor for driving the wheels. That is, the present disclosure is applicable as long as it electrically connects electric devices mounted in the vehicle V.

For example, as in the embodiments of FIGS. 3, 4, 6, and 7, when the electromagnetic wave absorbing members 70A and 70B are viewed from the length direction of the wire harness 10, the central axis of one of the wires 20A may be fixed eccentrically with respect to the central axis of the corresponding electromagnetic wave absorbing member 70A. In one example, the central axis of the other wire 20B may be fixed eccentrically with respect to the central axis of the corresponding electromagnetic wave absorbing member 70B (FIGS. 3, 6, 8 to 10, 13), and in another example, the central axis of the other wire 20B may be substantially concentric with the central axis of the corresponding electromagnetic wave absorbing member 70B (FIGS. 4 and 7).

As in the embodiments shown in FIGS. 3 and 4, when the electromagnetic wave absorbing members 70A and 70B are viewed from the length direction of the wire harness 10, the distance between the central axis of one electromagnetic wave absorbing member 70A and the central axis of the other electromagnetic wave absorbing member 70B may be smaller than the distance between the central axis of one wire 20A and the central axis of the other wire 20B.

As in the embodiments shown in FIGS. 6 and 7, when the electromagnetic wave absorbing members 70A and 70B are viewed from the length direction of the wire harness 10, the distance between the central axis of one electromagnetic wave absorbing member 70A and the central axis of the other electromagnetic wave absorbing member 70B may be greater than the distance between the central axis of one wire 20A and the central axis of the other wire 20B.

As shown in the illustrated embodiment, the electromagnetic wave absorbing member 70A does not need to overlap with the electromagnetic wave absorbing member 70B in the axial direction of the wire harness 10, and the electromagnetic wave absorbing member 70A may be spaced apart from the electromagnetic wave absorbing member 70B by a space in the axial direction of the wire harness 10. For example, as shown in FIGS. 2, 5, 8 to 10, and 13, the wire harness 10 can have a wire multiplexing length portion, which is a length range in which the wire 20A and the wire 20B are fixed side by side. The electromagnetic wave absorbing member 70A and the electromagnetic wave absorbing member 70B may be partially overlapped with each other in the radial direction such that the maximum thickness (maximum diameter) of the wire harness 10 in the wire multiplexing length portion is smaller than the total of the maximum thickness of the electromagnetic wave absorbing member 70A and the maximum thickness of the electromagnetic wave absorbing member 70B.

As in the embodiment shown in FIGS. 2, 5, and 8 to 10, the opening terminal end portion of the first outer cover member 40 may be separated with a space from the opening terminal end portion of the second outer cover member 50, and a predetermined axial-direction position of the wire 20A may be positioned in an axial-direction gap formed between the opening terminal end portion of the first outer cover member 40 and the opening terminal end portion of the second outer cover member 50. The opening terminal end portion of the first outer cover member 40 may face the side surfaces 72B of both electromagnetic wave absorbing members 70A and 70B, and the opening terminal end portion of the second outer cover member 50 may face the side surface 72C of both electromagnetic wave absorbing members 70A and 70B.

As in the embodiment shown in FIG. 13, the opening end portion of the first outer cover member 40 may be separated with a space from the end portion of the connector C1, and the predetermined axial-direction position of the wire 20A may be positioned in an axial-direction gap formed between the opening terminal end portion of the first outer cover member 40 and the end portion of the connector C1. The opening terminal end portion of the first outer cover member 40 may face the side surface 72B of both electromagnetic wave absorbing members 70A and 70B, and the end portion of the connector C1 may face the side surface 72C of both electromagnetic wave absorbing members 70A and 70B.

As shown in the drawing, the protective member 60 may be formed as a continuous tubular body that couples the opening terminal end portion of the first outer cover member 40 and the opening terminal end portion of the second outer cover member 50 (FIGS. 2, 5, 8 to 10) or the end portion of the connector C1 (FIG. 13) such that the opening terminal end portion of the first outer cover member 40 and the opening terminal end portion of the second outer cover member 50 (FIGS. 2, 5, 8 to 10) or the end portion of the connector C1 (FIG. 13) are spaced apart from each other with a gap in the axial direction. The protective member 60 may have a first tubular end portion configured to be attached to the outer surface in the radial direction of the opening terminal end portion of the first outer cover member 40, a second tubular end portion configured to be attached to the outer surface in the radial direction (FIGS. 2, 5, 8 to 10) of the opening terminal end portion of the second outer cover member 50 or the outer surface in the radial direction (FIG. 13) of the end portion of the connector C1, and a tubular intermediate portion extending between the first tubular end portion and the second tubular end portion. In one example, the tubular intermediate portion may be configured such that the axial-direction gap is not exposed to the outside of the wire harness 10. In the illustrated embodiment, the tubular intermediate portion of the protective member 60 may be configured to cover the entireties of the electromagnetic wave absorbing members 70A and 70B sandwiched between the opening terminal end portion of the first outer cover member 40 and the opening terminal end portion of the second outer cover member 50 (FIGS. 2, 5, 8 to 10) or the end portion of the connector C1 (FIG. 13), and the exposed portion of the braided member 90 that is not covered by the first outer cover member 40 and the second outer cover member 50 or the connector C1.

The embodiments disclosed herein are to be considered exemplary in all respects and not restrictive. The scope of the present disclosure is indicated by the scope of claims, not the above-mentioned meaning, and is intended to encompass all modifications within the meaning and range of equivalency to the claims.

The invention claimed is:

1. A wire harness comprising:
a first wire;
a ring-shaped first electromagnetic wave absorber having a first through hole through which the first wire passes;

a first restricting member that restricts relative movement of the first electromagnetic wave absorber with respect to the first wire in a length direction of the first wire;

a second wire;

a ring-shaped second electromagnetic wave absorber having a second through hole through which the second wire passes; and a second restricting member that restricts relative movement of the second electromagnetic wave absorber with respect to the second wire in a length direction of the second wire, wherein:

the first electromagnetic wave absorber is provided so as to overlap with a portion of the second electromagnetic wave absorber in a plan view from a first central axis direction in which a central axis of the first through hole extends;

an inner circumferential surface of the first through hole opposes an outer circumference of the first wire;

when the first electromagnetic wave absorber is viewed along the central axis of the first through hole, the inner circumferential surface of the first through hole has a first portion and a second portion arranged at a position point-symmetrical to the first portion with respect to the central axis of the first through hole;

the first restricting member fixes the first electromagnetic wave absorber to the first wire such that the first wire is in contact with the first portion and is separated from the second portion; and the first portion is a portion arranged at a position spaced apart from the second wire relative to the second portion in a direction intersecting the first central axis direction.

2. The wire harness according to claim 1, wherein:

an inner circumferential surface of the second through hole opposes an outer circumference of the second wire, when the second electromagnetic wave absorber is viewed along a central axis of the second through hole, the inner circumferential surface of the second through hole has a third portion and a fourth portion arranged at a position point-symmetrical to the third portion with respect to the central axis of the second through hole, the third portion is a portion arranged at a position spaced apart from the first wire relative to the fourth portion in a direction intersecting a second central axis direction in which the central axis of the second through hole extends, and the second restricting member fixes the second electromagnetic wave absorber to the second wire such that the second wire is in contact with the third portion and is separated from the fourth portion.

3. A wire harness comprising:

a first wire;

a ring-shaped first electromagnetic wave absorber having a first through hole through which the first wire passes;

a first restricting member that restricts relative movement of the first electromagnetic wave absorber with respect to the first wire in a length direction of the first wire;

a second wire;

a ring-shaped second electromagnetic wave absorber having a second through hole through which the second wire passes; and a second restricting member that restricts relative movement of the second electromagnetic wave absorber with respect to the second wire in a length direction of the second wire, wherein:

the first electromagnetic wave absorber is provided so as to overlap with a portion of the second electromagnetic wave absorber in a plan view from a first central axis direction in which a central axis of the first through hole extends;

an inner circumferential surface of the first through hole opposes an outer circumference of the first wire;

when the first electromagnetic wave absorber is viewed along the central axis of the first through hole, the inner circumferential surface of the first through hole has a first portion and a second portion arranged at a position point-symmetrical to the first portion with respect to the central axis of the first through hole;

the second portion is a portion arranged at a position near the second wire relative to the first portion in a direction intersecting the first central axis direction; and the first restricting member fixes the first electromagnetic wave absorber to the first wire such that the first wire is in contact with the second portion and is separated from the first portion.

4. The wire harness according to claim 3, wherein:

an inner circumferential surface of the second through hole opposes an outer circumference of the second wire, when the second electromagnetic wave absorber is viewed along the central axis of the second through hole, the inner circumferential surface of the second through hole has a third portion and a fourth portion arranged at a position point-symmetrical to the third portion with respect to the central axis of the second through hole, the fourth portion is a portion arranged at a position near the first wire relative to the third portion in a direction intersecting a second central axis direction in which the central axis of the second through hole extends, and the second restricting member fixes the second electromagnetic wave absorber to the second wire such that the second wire is in contact with the fourth portion and is separated from the third portion.

* * * * *